US010727374B2

(12) United States Patent
Richardson et al.

(10) Patent No.: US 10,727,374 B2
(45) Date of Patent: Jul. 28, 2020

(54) TRANSPARENT CONDUCTIVE STRUCTURE AND FORMATION THEREOF

(71) Applicant: Seoul Semiconductor Co., Ltd., Ansan (KR)

(72) Inventors: Jacob J. Richardson, Santa Barbara, CA (US); Evan C. O'Hara, Santa Barbara, CA (US); Chanseob Shin, Ansan (KR)

(73) Assignee: Seoul Semiconductor Co., Ltd., Asan, Gyeonggi-do (KR)

( * ) Notice: Subject to any disclaimer, the term of this patent is extended or adjusted under 35 U.S.C. 154(b) by 0 days.

(21) Appl. No.: 14/846,655

(22) Filed: Sep. 4, 2015

(65) Prior Publication Data

US 2017/0069797 A1    Mar. 9, 2017

(51) Int. Cl.
*H01L 33/42* (2010.01)
*H01L 51/00* (2006.01)
(Continued)

(52) U.S. Cl.
CPC ........ *H01L 33/42* (2013.01); *H01L 21/67011* (2013.01); *H01L 31/022425* (2013.01);
(Continued)

(58) Field of Classification Search
None
See application file for complete search history.

(56) References Cited

U.S. PATENT DOCUMENTS 2,990,256 A    6/1961    Lovins
4,667,076 A    5/1987    Amada
(Continued)

FOREIGN PATENT DOCUMENTS

CN    102774875    11/2012
CN    102774875 A    11/2012
(Continued)

OTHER PUBLICATIONS

International Preliminary Report on Patentability for PCT Application PCT/US17/27335 dated Oct. 25, 2018, 10 pages.
(Continued)

*Primary Examiner* — Steven B Gauthier
(74) *Attorney, Agent, or Firm* — Berkeley Law & Technology Group, LLP

(57) ABSTRACT

Briefly, in accordance with one embodiment, a transparent conductive structure and method to form such a structure are described. For example, an apparatus may include an optoelectronic device. In such an embodiment, an optoelectronic device may include one or more zinc oxide crystals forming a single contiguous three-dimensional transparent conductive structure. The single contiguous three-dimensional transparent conductive structure may include one or more regions thereof having one or more three dimensional geometrical features in the one or more regions of the single contiguous three-dimensional transparent conductive structure so that the single contiguous three-dimensional transparent conductive structure possesses additional electrical-type and/or optical-type properties. For example, additional electrical-type and/or optical-type properties may include electrical current management and/or light management properties.

28 Claims, 26 Drawing Sheets

(51) Int. Cl.

| | | |
|---|---|---|
| *H01L 31/18* | (2006.01) | |
| *H01L 31/054* | (2014.01) | |
| *H01L 21/67* | (2006.01) | |
| *H01L 31/0224* | (2006.01) | |
| *H01L 31/0304* | (2006.01) | |
| *H01L 33/38* | (2010.01) | |
| *H01L 51/52* | (2006.01) | |
| *H01L 33/00* | (2010.01) | |
| *H01L 33/32* | (2010.01) | |

(52) U.S. Cl.
CPC ............. *H01L 31/022483* (2013.01); *H01L 31/03044* (2013.01); *H01L 31/054* (2014.12); *H01L 31/1856* (2013.01); *H01L 31/1884* (2013.01); *H01L 31/1888* (2013.01); *H01L 33/38* (2013.01); *H01L 51/0021* (2013.01); *H01L 33/0075* (2013.01); *H01L 33/32* (2013.01); *H01L 51/5203* (2013.01); *H01L 2933/0016* (2013.01); *H01L 2933/0091* (2013.01); *Y02E 10/52* (2013.01); *Y02E 10/549* (2013.01); *Y02P 70/521* (2015.11)

(56) References Cited

U.S. PATENT DOCUMENTS

| | | |
|---|---|---|
| 5,770,126 A | 6/1998 | Singh |
| 6,057,662 A | 5/2000 | McAndrew |
| 6,078,064 A | 6/2000 | Ming-Jiunn et al. |
| 6,409,907 B1 | 6/2002 | Braun et al. |
| 6,776,173 B2 | 8/2004 | Kamikawa |
| 8,183,575 B2 | 5/2012 | Farmer et al. |
| 8,536,618 B2 | 9/2013 | Richardson et al. |
| 8,668,774 B2 | 3/2014 | Richardson et al. |
| 8,729,580 B2 | 5/2014 | Lester |
| 8,790,614 B2 | 7/2014 | Richards |
| 8,796,693 B2 | 8/2014 | Richardson et al. |
| 8,637,334 B2 | 11/2014 | Thompson et al. |
| 8,926,750 B2 | 1/2015 | Richardson |
| 10,407,315 B2 | 9/2019 | Richardson |
| 2001/0051499 A1 | 12/2001 | Shinozak |
| 2002/0092464 A1 | 7/2002 | Nakagawa |
| 2002/0096196 A1 | 7/2002 | Toshima |
| 2002/0104476 A1 | 8/2002 | Ferguson |
| 2003/0084838 A1 | 5/2003 | McCandlish |
| 2005/0196887 A1 | 9/2005 | Liu |
| 2006/0124051 A1 | 6/2006 | Yoshioka |
| 2009/0017303 A1 | 1/2009 | Choy |
| 2009/0134152 A1 | 5/2009 | Sedlmayr |
| 2010/0263586 A1 | 10/2010 | Richardson |
| 2011/0101414 A1 | 5/2011 | Thompson et al. |
| 2011/0143048 A1 | 6/2011 | Oladeji |
| 2011/0204324 A1* | 8/2011 | Kim ............... G02B 6/0073 257/13 |
| 2011/0259879 A1 | 10/2011 | Hanawa |
| 2012/0048721 A1 | 3/2012 | Koji |
| 2012/0255929 A1 | 10/2012 | Franssila |
| 2012/0270013 A1* | 10/2012 | Kim ............... H01L 31/022483 428/141 |
| 2013/0228808 A1* | 9/2013 | Lester ............. H01L 33/44 257/98 |
| 2014/0083352 A1 | 3/2014 | Richardson |
| 2014/0087567 A1 | 3/2014 | Toyoda |
| 2014/0105808 A1 | 4/2014 | McNeel |
| 2014/0306236 A1 | 10/2014 | Richardson et al. |
| 2016/0024688 A1 | 1/2016 | Richardson |
| 2016/0130719 A1 | 5/2016 | Richardson |
| 2017/0297920 A1 | 10/2017 | Richardson |
| 2017/0297921 A1 | 10/2017 | Richardson |
| 2017/0297922 A1 | 10/2017 | Richardson |
| 2020/0039836 A1 | 2/2020 | Richardson |

FOREIGN PATENT DOCUMENTS

| | | |
|---|---|---|
| CN | 102950016 | 3/2013 |
| CN | 103774224 | 5/2014 |
| CN | 103922390 | 7/2014 |
| CN | 103943366 | 7/2014 |
| CN | 109415809 A | 3/2019 |
| EP | 1901363 | 3/2008 |
| JP | 2008-169053 | 7/2008 |
| JP | 2009046358 | 3/2009 |
| JP | 2011054866 A | 3/2011 |
| WO | 201106347 A1 | 9/2011 |
| WO | 2014/147290 A | 9/2014 |
| WO | WO2014147290 A1 | 9/2014 |
| WO | 2014196256 A1 | 12/2014 |

OTHER PUBLICATIONS

Andeen, et al, "Crystal chemistry of epitaxial ZnOon (1 1 1) MgAl204 produced by hydrothermal synthesis," Journal of Crystal Growth, 259, doi:10.1016/S0022-0248(03)01589-6, 2003, pp. 103-109.

KhepriCoat marketing, Same Sun, More Power, Royal DSM, KhepriCoat, 2012, http://www.dsm.com/contentldam/dsm/cworld/en_US/documents/khepricoat-product-brochure.pdf, 8 Pages.

Kim, et al, "Growth of Heteroepitaxial ZnO Thin Films on GaN-Buffered Al2O3 (0001) Substrates by Low-Temperature Hydrothermal Synthesis at 90 ° C.," Advanced Functional Materials, 2007, 17, pp. 463-471.

Kim, et al, "Light-Extraction Enhancement of GaInN Light-Emitting Diodes by Graded-Refractive-Index Indium Tin Oxide Anti-Reflection Contact," Advanced Materials, DOI: 10.1002/adma.200701015, 2008, 20, pp. 801-804.

Nijikovsky, et al, "Microstructure of ZnO films synthesized on MgAl2O4 from low-temperature aqueous solution: growth and post-annealing," J Mater Sci (2013) 48:1614-1622, DOI 10.1007/s10853-012-6918-9.

Reading, et al, "High efficiency white LEDs with single-crystal ZnO current spreading layers deposited by aqueous solution epitaxy," Jan. 2, 2012, vol. 20, No. 81 Optics Express, pp. A13-A19.

Richardson, et al, "Controlling Low Temperature Aqueous Synthesis of ZnO. 2. A Novel Continuous Circulation Reactor," Crystal Growth & Design, vol. 9, No. 6, 2009, pp. 2576-2581.

Richardson, et al, "Controlling Low Temperature Aqueous Synthesis of ZnO. 1. Thermodynamic Analysis," Crystal Growth & Design, vol. 9, No. 6, pp. 2570-2575.

Richardson, et al, "Rapid synthesis of epitaxial ZnO films from aqueous solution using microwave heating," Journal of Materials Chemistry, www.rsc.org/materials, The Royal Society of Chemistry, 2010, 7 Pages.

Richardson, et al, "Semipolar Single-Crystal ZnO Films Deposited by Low-Temperature Aqueous Solution Phase Epitaxy on GaN Light-Emitting Diodes," Applied Physics Express 4, 2011 The Japan Society of Applied Physics, pp. xxxxxx-1-xxxxxx-3.

Richardson, et al, "Thermally Induced Pore Formation in Epitaxial ZnO Films Grown from Low Temperature Aqueous Solution," Crystal Growth & Design, 2011, 11 (8), pp. A-F.

Stiegler, et al, "Correlative infrared-electron nanoscopy reveals the local structure-conductivity relationship in zinc oxide nanowires," Nature Communications, 3:1131, DOI: 10.1038/ncomms21181 www.nature.com/ naturecommunications, Oct. 16, 2012, pp. 1-7.

Thompson, et al, "Light Emitting Diodes with ZnO Current Spreading Layers Deposited from a Low Temperature Aqueous Solution," Applied Physics Express 2 (2009), 2009 The Japan Society of Applied Physics, pp. 042101-1-042101-3.

U.S. Appl. No. 15/099,573, filed Apr. 14, 2016, 120 pages.
U.S. Appl. No. 15/099,575, filed Apr. 14, 2016, 120 pages.
U.S. Appl. No. 15/099,580, filed Apr. 14, 2016, 122 pages.
U.S. Appl. No. 14/341,700, filed Jul. 25, 2014, 69 Pages.
U.S. Appl. No. 14/341,700, / Filing Receipt ,dated Aug. 6, 2014, 3 pages.
U.S. Appl. No. 14/341,700, / Notice to File Corrected Application Papers, dated Aug. 6, 2014, 2 pages.

(56) References Cited

OTHER PUBLICATIONS

U.S. Appl. No. 14/341,700, / Applicant Response to Pre-Exam Formalities Notice and Amendments, dated Oct. 6, 2014, 120 pages.
U.S. Appl. No. 14/341,700, / Filing Receipt, dated Oct. 9, 2014, 3 pages.
U.S. Appl. No. 14/341,700, / Filing Receipt, dated Oct. 17, 2014, 3 pages.
U.S. Appl. No. 14/341,700, / Requirement for Restriction/Election, dated Jan. 27, 2016, 7 pages.
U.S. Appl. No. 14/341,700, / Notice of Publication, dated Jan. 28, 2016, 1 page.
U.S. Appl. No. 14/341,700, / Response to Election/Restriction and Amendment, dated Feb. 16, 2016, 6 pages.
U.S. Appl. No. 14/341,700, / Non-Final Rejection, dated Mar. 7, 2016, 6 pages.
Corial, "Corial 300IL:GaN & Sapphire Etching ICP System," http://www.corial.net/resources/13_300IL/Corial300IL.pdf, Feb. 24, 2015, 19 Pages.
Andeen, et al, "Lateral Epitaxial Overgrowth of ZnO in Water at 90° C.," Adv. Funct. Mater., vol. 16 No. 6, Apr. 2006, pp. 799-804.
Kim, et al, "Hydrothermal Growth of Periodic, Single-Crystal ZnO Microrods and Microtunnels," Adv. Mater., vol. 18, No. 18, Sep. 2006, pp. 2453-2457.
Richardson, et al, "A facile route to patterned epitaxial ZnO nanostructures by soft lithography," J. Mater. Chem., vol. 21, No. 38, 2011, pp. 14417-14419.
Pooley, et al, "Constrained, aqueous growth of three-dimensional single crystalline zinc oxide structures," APL Mater., vol. 2, No. 1, Jan. 2014, pp. 012111-1-012111-6.
Scharrer, et al, "Fabrication of inverted opal ZnO photonic crystals by atomic layer deposition," App. Phys. Lett., vol. 86, No. 15, 2005, pp. 151113-1-151113-3.
Wikipedia, "Etching (microfabrication)," http://en.wikipedia.org/wiki/Etching_%28microfabrication%29, Sep. 2, 2015.
Wikipedia, "Light-emitting diode," http://en.wikipedia.org/wiki/Light-emitting_diode, Sep. 2, 2015.
Wikipedia, "Colloidal crystal," http://en.wikipedia.org/wiki/Colloidal_crystal, Sep. 2, 2015.
Wikipedia, "Thin-film solar cell," http://en.wikipedia.org/wiki/Thin_film_solar_cell, Sep. 2, 2015.
Wikipedia, "OLED," http://en.wikipedia.org/wiki/OLED, Sep. 2, 2015.
Richardson, et al, U.S. Appl. No. 14/341,700, filed Jul. 25, 2014, 62 Pages.
Richardson, et al, U.S. Appl. No. 14/537,487, filed Nov. 10, 2014, 20 Pages.
U.S. Appl. No. 15/099,573 / Final Rejection, dated Jun. 14, 2018, 22 pages.
U.S. Appl. No. 15/099,575 / Amendment/Req. Reconsideration-After Non-Final Rejection, dated Jun. 27, 2018, 21 pages.
U.S. Appl. No. 15/099,580 / Response After Final Action, dated Jul. 10, 2018, 20 pages.
U.S. Appl. No. 14/341,700, / Non-Final Rejection, dated Jun. 13, 2018, 8 pages.
U.S. Appl. No. 15/099,573 / Applicant Response to Pre-Exam Formalities Notice, dated Jun. 8, 2016, 19 pages.
U.S. Appl. No. 15/099,573 / Filing Receipt, dated Jun. 15, 2016, 3 pages.
U.S. Appl. No. 15/099,575 / Applicant Response to Pre-exam Formalities Notice, dated Jun. 8, 2016, 25 pages.
U.S. Appl. No. 15/099,575 / Filing Receipt, dated Jun. 17, 2016, 3 pages.
U.S. Appl. No. 15/099,580 / Applicant Response to Pre-exam Formalities Notice, dated Jun. 8, 2016, 25 pages.
U.S. Appl. No. 15/099,580 / Filing Receipt, dated Jun. 16, 2016, 3 pages.
U.S. Appl. No. 14/341,700, / Amendment/Req. Reconsideration-After Non-Final Rejection, dated Jul. 7, 2016, 136 pages.

Notification of Transmittal of the International Search Report and the Written Opinion of the international Searching Authority, or the Declaration, App. No. PCT/IB2016/055272, dated Jun. 19, 2017, 14 Pages.
Communication in Cases for Which No Other Form is Appiicable, App. No. PCT/IB2016/055272, dated Oct. 3, 2016, 2 Pages.
Baddi, "Use LEDs as photodiodes," EDN Network, Nov. 18, 2010, https://www.edn.com/design/led/4363842/Use-LEDs-as-photodiodes, 1 Page.
U.S. Appl. No. 15/099,580 / Requirement for Restriction/Election, dated May 4, 2017, 5 pages.
U.S. Appl. No. 15/099,580 / Response to Election/Restriction Filed, dated Jul. 5, 2017, 7 pages.
U.S. Appl. No. 14/341,700, / Non-Final Rejection, dated Apr. 17, 2017, 10 pages.
U.S. Appl. No. 14/341,700, / Amendment/Req. Reconsideration-After Non-Final Reject, dated Jul. 17, 2017, 80 pages.
PCT/US17/27335 / International Search Report and Written Opinion, dated Aug. 25, 2017, 22 pages.
U.S. Appl. No. 14/341,700, / RCE and Amendments, dated Mar. 13, 2017, 22 pages.
Nicholas, et al., "The mechanism for hydrothermal growth of zinc oxide", CrystEngComm, www.rsc.org/crystengcomm, 2011, vol. 14, No. 4, Feb. 21, 2012, pp. 1232-1240.
Wang, et al., From Zn(OH)2 to ZnO: a study on the mechanism of phase transformation, CrystEngComm, www.rsc.org/crystengcomm, 2011, vol. 13, pp. 6024-6026.
U.S. Appl. No. 15/099,573 / Notice of Publication, dated Oct. 19, 2017, 1 page.
U.S. Appl. No. 15/099,575/ Notice of Publication, dated Oct. 19, 2017, 1 page.
U.S. Appl. No. 15/099,580 / Non-Final Rejection, dated Oct. 4, 2017, 9 pages.
U.S. Appl. No. 15/099,580 / Notice of Publication, dated Oct. 19, 2017, 1 page.
U.S. Appl. No. 14/341,700, / Final Rejection, dated Oct. 18, 2017, 12 pages.
U.S. Appl. No. 15/099,573 / Non-Final Rejection, dated Jan. 24, 2018, 21 pages.
U.S. Appl. No. 15/099,575 / Requirement for Restriction/Election, dated Dec. 28, 2017, 8 pages.
U.S. Appl. No. 15/099,580 / Amendment/Req. Reconsideration-After Non-Final Reject, dated Jan. 4, 2018, 13 pages.
U.S. Appl. No. 14/341,700, / After Final Consideration Program Request, dated Feb. 15, 2018, 98 pages.
Gregory, O.J. et al., "Fabrication of High Conductivity, Transparent Electrodes with Trenched Metal Bus Lines", J. Electrochem. Soc., vol. 138, No. 7, Jul. 1991.
U.S. Appl. No. 15/099,575 / Response to Restriction/Election and Amendments, dated Feb. 26, 2018, 7 pages.
U.S. Appl. No. 15/099,575 / Non-Final Rejection, dated Mar. 27, 2018, 20 pages.
U.S. Appl. No. 15/099,580 / Final Rejection, dated May 7, 2018, 16 pages.
U.S. Appl. No. 14/341,700, / After Final Consideration Program Decision, dated Mar. 1, 2018, 1 page.
U.S. Appl. No. 14/341,700, / Advisory Action, dated Mar. 1, 2018, 2 pages.
U.S. Appl. No. 14/341,700, / RCE and Amendments, dated Mar. 19, 2018, 56 pages.
U.S. Appl. No. 15/099,573 / Non-Final Rejection, dated Mar. 20, 2019, 34 pages.
U.S. Appl. No. 15/099,575 / Amendment/Req. Reconsideration-after Non-Final Rejection, dated Apr. 5, 2019, 12 pages.
U.S. Appl. No. 15/099,580 / Amendment/Req. Reconsideration-After Non-Final Rejection, dated Dec. 26, 2018, 18 pages.
U.S. Appl. No. 14/341,700, / Notice to the applicant regarding a non-compliant or non-responsive amendment, dated Feb. 4, 2019, 3 pages.
U.S. Appl. No. 14/341,700, / Amendment/Req. Reconsideration-After Non-Final Reject, dated Feb. 15, 2019, 55 pages.
U.S. Appl. No. 15/099,573 / After Final Consideration Program Request, dated Aug. 17, 2018, 44 pages.

(56) References Cited

OTHER PUBLICATIONS

U.S. Appl. No. 15/099,573 / Advisory Action, dated Sep. 18, 2018, 4 pages.
U.S. Appl. No. 15/099,575 / Final Rejection, dated Aug. 13, 2018, 18 pages.
U.S. Appl. No. 15/099,580 / Advisory Action, dated Aug. 9, 2018, 3 pages.
U.S. Appl. No. 15/099,580 / RCE and Amendments, dated Sep. 6, 2018, 20 pages.
Entegris, "Measuring Liquid in a Vessel With Gaseous Head Pressure", 2004, 2 pages.
U.S. Appl. No. 15/099,573 / RCE and Amendments, dated Oct. 15, 2018, 31 pages.
U.S. Appl. No. 15/099,575 / Response After Final Action, dated Nov. 13, 2018, 33 pages.
U.S. Appl. No. 15/099,575 / Advisory Action, dated Nov. 21, 2018, 3 pages.
U.S. Appl. No. 15/099,575 / RCE and Amendments, dated Dec. 10, 2018, 34 pages.
U.S. Appl. No. 15/099,580 / Non-Final Rejection, dated Oct. 2, 2018.
U.S. Appl. No. 14/341,700, / Amendment/Req. Reconsideration-After Non-Final Reject, dated Oct. 12, 2018, 31 pages.
Ahn et al, "Effects of a low-temperature sulfidation process . . . ZnO nanowires . . . " Cryst. Eng. Comm. 15 , pp. 6709-6714. (Year 2013).
Translation of CN 103774224 (Year 2014).
Translation of Japan 2008-169053 (Year 3008).
U.S. Appl. No. 15/099,575 / Final Rejection, dated May 10, 2019, 20 pages.
U.S. Appl. No. 15/099,580 / Notice of Allowance and Fees Due, dated Apr. 18, 2019, 8 pages.
U.S. Appl. No. 14/341,700, / Non-Final Rejection, dated May 21, 2019, 16 pages.
U.S. Appl. No. 15/099,573 / Amendment/Req. Reconsideration-After Non-Final Rejection, dated Jun. 19, 2019, 27 pages.
U.S. Appl. No. 15/099,573, Response After Final Action, dated Sep. 26, 2019, 31 pages.
U.S. Appl. No. 15/099,573, Advisory Action, dated Oct. 2, 2019, 4 pages.
U.S. Appl. No. 15/099,575, Response after Final Rejection, dated Jul. 10, 2019, 19 pages.
U.S. Appl. No. 15/099,575, Advisory Action, dated Jul. 19, 2019, 5 pages.
U.S. Appl. No. 15/099,575, RCE and Amendments, dated Aug. 12, 2019, 19 pages.
U.S. Appl. No. 15/099,575, Non-Final Rejection, dated Sep. 24, 2019, 18 pages.
U.S. Appl. No. 15/099,580, Amendment After notice of Allowance, dated Jul. 18, 2019, 3 pages.
U.S. Appl. No. 15/099,580, Issue Fee Payment, dated Jul. 18, 2019, 1 page.
U.S. Appl. No. 15/099,580, Notice of Allowance and Fees Due, dated Jul. 29, 2019, 2 pages.
U.S. Appl. No. 15/099,580, Issue Notification, dated Aug. 21, 2019, 1 page.
U.S. Appl. No. 16/539,182, filed Aug. 13, 2019, 133 pages.
U.S. Appl. No. 16/539,182, Filing Receipt and Notice to File Missing Parts, dated Aug. 23, 2019, 5 pages.
U.S. Appl. No. 15/099,573, Request for Examination filed Oct. 28, 2019, 39 pages, Doc 1000.
U.S. Appl. No. 15/099,573, Non-final Office Action dated Dec. 12, 2019, 28 pages, Doc 1001.
U.S. Appl. No. 15/099,575, Response to Non-final Office Action filed Dec. 19, 2019, 22 pages, Doc 1008.
U.S. Appl. No. 15/099,575, Response to Non-final Office Action filed Jan. 29, 2020, 30 pages, Doc 1009.
U.S. Appl. No. 16/539,182, Notice to File Corrected Application Papers dated Aug. 23, 2019, 2 pages, Doc 1014.
U.S. Appl. No. 16/539,182, Response to Notice to File Corrected Application Papers with Replacement Figures filed Oct. 23, 2019, 20 pages, Doc 1015.
U.S. Appl. No. 16/539,182, Notice of Publication dated Feb. 6, 2020, 1 page, Doc 1016.
U.S. Appl. No. 14/341,700, Response to Non-final Office Action filed Oct. 20, 2019, 18 pages, Doc 1017.
U.S. Appl. No. 14/341,700, Office Communication dated Jan. 10, 2020, 2 pages, Doc 1018.
U.S. Appl. No. 14/341,700, Response to Office Communication filed Jan. 16, 2020, 21 pages, Doc 1020.
Guder, et. al., "Improved Optical Properties of ZnO Thin Films by Concurrently Introduced Interfacial Voids During Thermal Annealing", App. Phys. Let. 99, 2011. (Year—2011), 4 pages.
U.S. Appl. No. 15/099,573, Examiner Interview Summary dated Mar. 13, 2020, 7 pages, Doc 1002.
U.S. Appl. No. 15/099,573, Response to Non-final Office Action filed Apr. 7, 2020, 22 pages, Doc 1003.
U.S. Appl. No. 15/099,573, Final Office Action dated Apr. 16, 2020, 10 pages, Doc 1004.
U.S. Appl. No. 15/099,573, Response to Final Office Action filed Apr. 30, 2020, 12 pages, Doc 1005.
U.S. Appl. No. 15/099,573, Response to Final Office Action filed May 7, 2020, 123 pages, Doc 1006.
KR 10-2018-7032790, Request for Examination filed Apr. 9, 2020, 12 pages, Doc 1007.
U.S. Appl. No. 15/099,575, Response to Non-final Office Action filed Mar. 30, 2020, 18 pages, Doc 1010.
U.S. Appl. No. 15/099,575, Advisory Action dated Apr. 6, 2020, 5 pages, Doc 1011.
U.S. Appl. No. 15/099,575, RCE and Amendment filed Apr. 29, 2020, 19 pages, Doc 1012.
U.S. Appl. No. 15/099,575, Non-final Office Action dated May 8, 2020,72 pages, Doc 1013.
U.S. Appl. No. 14/341,700, Final Office Action dated Apr. 29, 2020, 18 pages, Doc 1019.

\* cited by examiner

FIG. 11    1100

FIG. 12
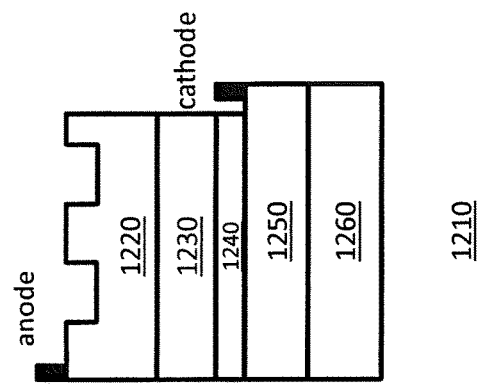
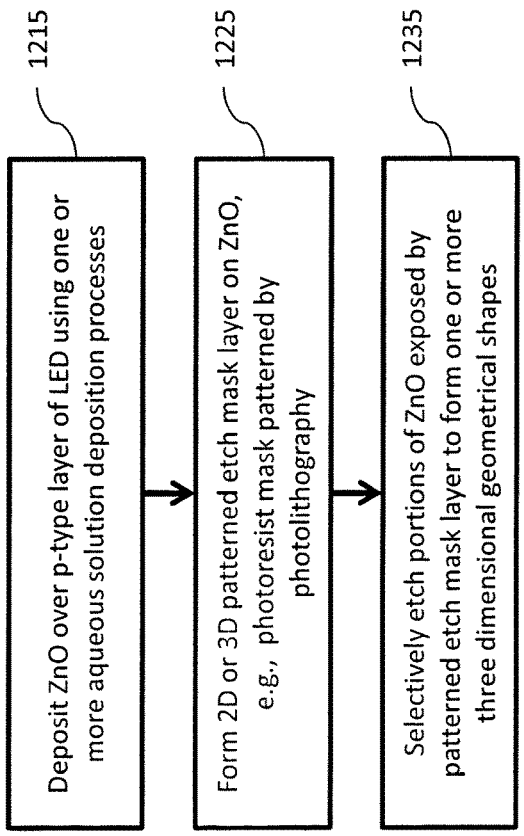

FIG. 13
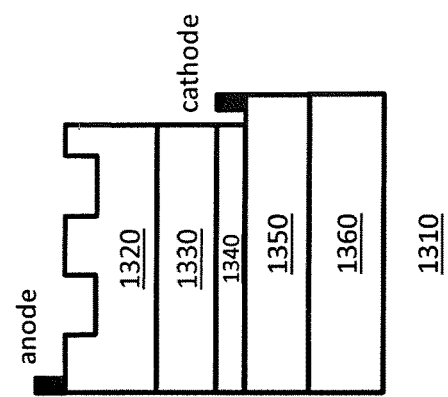
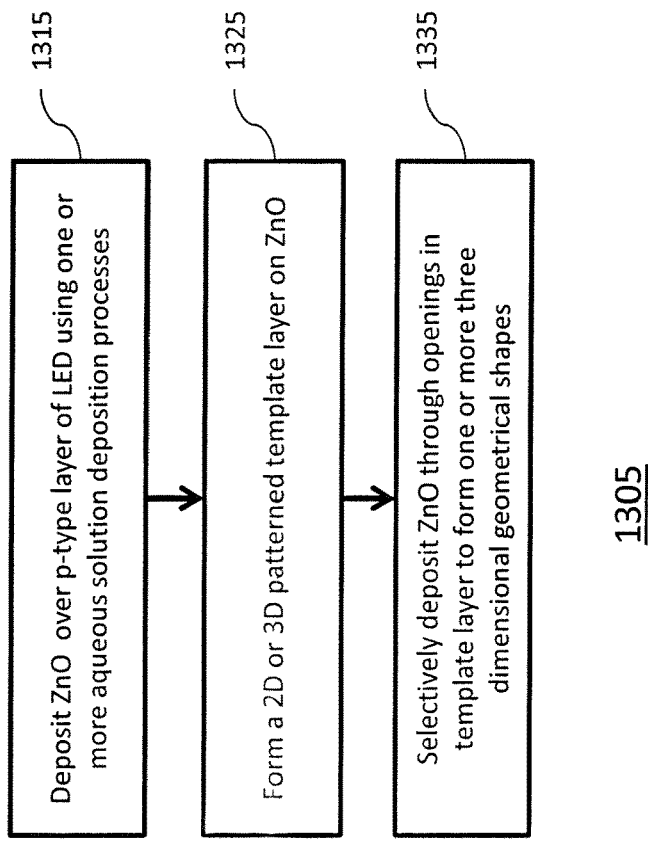

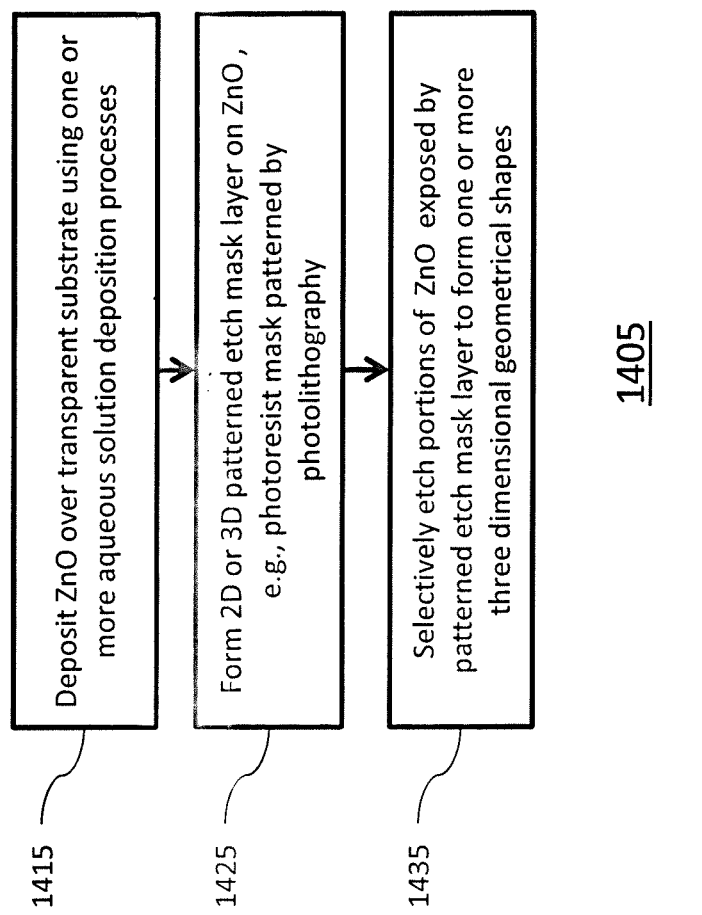
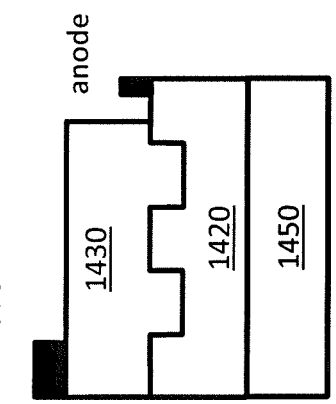
FIG. 14

FIG. 21
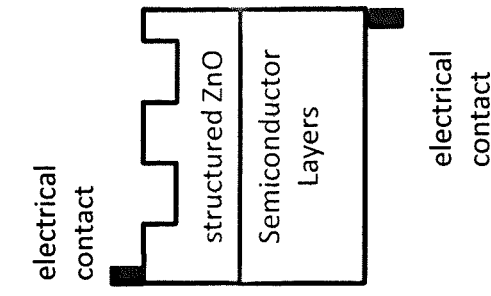
Un-supported device w/ 1 ZnO layer
2130
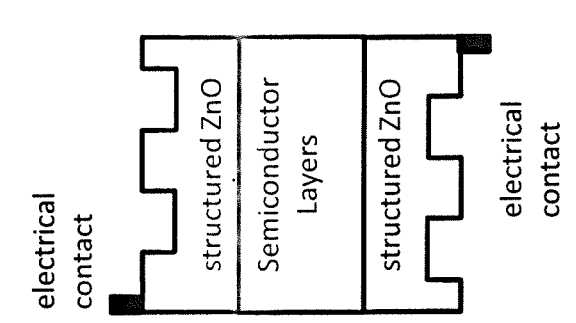
Un-supported device w/ 2 ZnO layers
2120
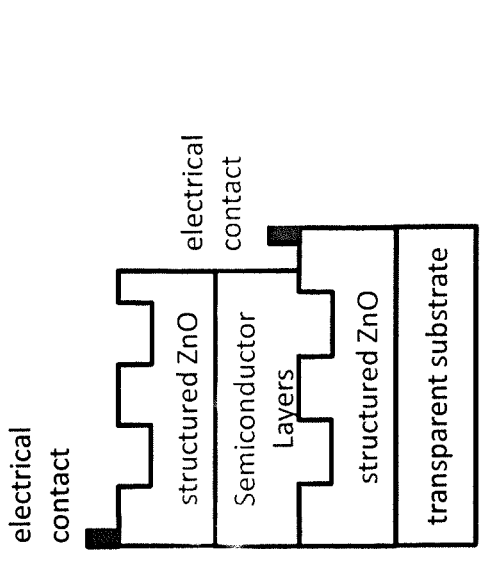
Substrate supported device w/ 2 ZnO layers
2110

ZnO crystals of substantially the same orientation

TRANSPARENT CONDUCTIVE STRUCTURE AND FORMATION THEREOF

FIELD

Subject matter disclosed herein relates to crystalline zinc oxide, such as processes for preparation thereof and/or uses thereof, including, for example, to form a transparent, conductive structure.

INFORMATION

In a variety of different contexts, too numerous to conveniently describe here, it may be desirable for a material to have certain properties, such as being electrically conductive, as well as having certain optical and/or optical-type properties, as an example. A transparent and electrically conductive substance may, to illustrate, be used to manufacture films, layers and/or coatings (hereinafter, "layer" used without "film and/or coating" is nonetheless understood in context to mean "film, layer and/or coating") for a variety of optoelectronic devices, such as, to provide some non-limiting examples: a light emitting diode (LED); a laser diode; an organic light emitting diode (OLED); a photovoltaic cell; a liquid crystal display; and/or a touch sensor display. One substance that may be employed in this capacity, for example, is zinc oxide. Processes to form transparent conductive structures using zinc oxide continue to be sought.

BRIEF DESCRIPTION OF THE DRAWINGS

Claimed subject matter is particularly pointed out and distinctly claimed in the concluding portion of this specification. However, both as to organization and/or method of operation, together with objects, features, and/or advantages thereof, it may best be understood by reference to the following detailed description if read with the accompanying drawings in which:

FIG. 12 is a schematic diagram of an embodiment of an LED capable of being fabricated, including a flowchart of an associated fabrication process embodiment;

FIG. 13 is a schematic diagram of another embodiment of an LED capable of being fabricated, including a flowchart of another associated fabrication process embodiment;

FIG. 14 is a schematic diagram of an embodiment of an OLED capable of being fabricated, including a flowchart of an associated fabrication process embodiment;

FIGS. 20 and 21 are schematic diagrams illustrating a variety of possible structure embodiments of LED devices and structure embodiments of photovoltaic cell devices, respectively;

Figure 1:
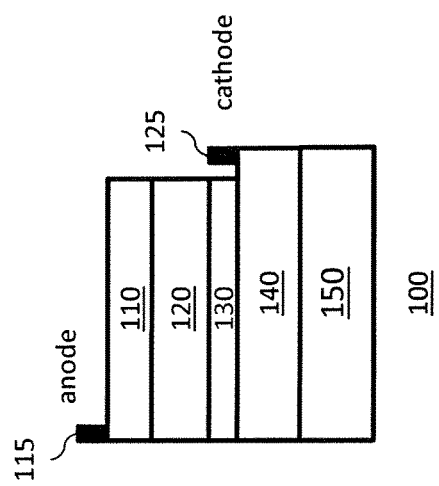
FIG. 1 is a schematic diagram of an embodiment of an optoelectronic device.

Reference is made in the following detailed description to accompanying drawings, which form a part hereof, wherein like numerals may designate like parts throughout to indicate corresponding and/or analogous components and/or aspects. It will be appreciated that components and/or aspects illustrated in the figures have not necessarily been drawn to scale, such as for simplicity and/or clarity of illustration. For example, dimensions may be exaggerated relatively speaking. Further, it is to be understood that other embodiments in addition to those described herein may be utilized. For example, structural and/or other changes may be made without departing from claimed subject matter. It should also be noted that directions and/or references, for example, up, down, top, bottom, and so on, may be used to facilitate discussion of the drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment described. Furthermore, it is to be understood that particular features, structures, and/or characteristics described are capable of being combined in various ways in one or more implementations and/or embodiments and, therefore, are within intended claim scope, for example. In general, of course, these and other issues vary with context. Therefore, particular context of description and/or usage provides helpful guidance regarding inferences to be drawn.

Likewise, in this context, the terms "coupled", "connected," and/or similar terms are used generically. It should be understood that these terms are not intended as synonyms. Rather, "connected" is used generically to indicate that two or more components and/or the like, for example, are in direct physical, including electrical, contact; while, "coupled" is used generically to mean that two or more components and/or the like are potentially in direct physical (potentially including electrical) contact; "coupled" is also used generically to mean that two or more components and/or the like are not necessarily in direct physical contact, but nonetheless are able to co-operate and/or interact, such as, for example, being "optically coupled." The term coupled is also understood generically to mean indirectly connected, for example, in an appropriate context.

Additionally, in this context, a distinction exists herein (e.g., in this patent application) between being "on" and being "over." As an example, deposition of a substance "on" a substrate refers to a deposition involving direct physical contact without an intermediary, such as an intermediary substance, between the substance deposited and the substrate in this latter example; nonetheless, deposition "over" a substrate, while generally understood to potentially include deposition "on" a substrate (since being "on" may also accurately be described as being "over"), is generally understood to include a situation in which one or more intermediaries, such as one or more intermediary substances, are present between the substance deposited and the substrate so that the substance deposited does not necessarily directly physically contact the substrate. A similar distinction is made herein between being "beneath" and being "under" (e.g., underlying). While "beneath" in this context is intended to necessarily imply physical contact (like "on" as just described), "under" potentially includes a situation in which there is direct physical contact, but does not necessarily imply direct physical contact, such as if one or more intermediaries, such as one or more intermediary substances, are present. Thus, "on" generically is understood to mean "immediately over" and "beneath" is generically understood to mean "immediately under." It is likewise appreciated that terms such as "over" or "under" are understood in a similar manner as the terms up, down, top, bottom, and so on, previously mentioned. These terms may be used to facilitate discussion, but are not intended to restrict application of claimed subject matter. For example, the term "over" as an example is not meant to suggest that claim scope is limited to only situations in which an embodiment is right side up, such as in comparison with the embodiment being upside down, for example. An example includes a flip chip product as one illustration in which, for example, orientation at various times (e.g., during fabrication) may not necessarily correspondence to orientation of a final product. However, with this example, if a product is within applicable claim scope in a particular orientation, such as upside down, as one example, likewise it is intended that the latter also be included within applicable claim scope in another orientation, such as right side up, again, as an example, and vice-versa. Again, particular context of description and/or usage provides helpful guidance regarding inferences to be drawn.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. It is further noted that the terms "type" or "like" if used with a feature or other characterization of a physical manifestation, using "optical" or "electrical" as an example, means at least partially of or relating to the feature or other characterization in such a way that the presence of minor variations that might otherwise not be considered fully consistent with the feature or other characterization do not prevent the feature or other characterization from being of a "type" or being "like," such as being, for example "optical-type" or "optical-like," if the minor variations are sufficiently minor so that the feature or other characterization would still be considered to be substantially present. Thus, continuing with this example, the term optical-type or optical-like properties are intended to include optical properties as well. Likewise, the term electrical-type or electrical-like properties, as another example, are likewise intended to include electrical properties. Of course, for all of the foregoing, particular context of description and/or usage provides helpful guidance regarding inferences to be drawn. It should be noted that the following description merely provides one or more illustrative examples and claimed subject matter is intended to not be limited to one or more illustrative examples; however, again, particular context of description and/or usage provides helpful guidance regarding inferences to be drawn.

Transparent conductive layers may be used desirably in numerous optoelectronic devices, such as those previously mentioned. Indium Tin Oxide (ITO) is currently the most commonly used transparent conductive material for these applications. ITO can have relatively high electrical conductivity, but also relatively high optical absorptivity, such as in the visible spectrum. For many applications, this means that an ITO layer may typically be limited to a thickness of a few hundred nanometers (nm) before too much of the light passing into the layer may become absorbed. For some applications, this may not be a significant issue. An ITO layer of less than a few hundred nanometers, for example, may still be suitable for several, if not many, situations. However, ITO may not be well suited to form a transparent structure in which a dimension normal to the surface of a structure is larger than a few hundred nm. Thus, it could be beneficial to form patterns for a transparent conductive structure out of a material with lower optical absorptivity so that variations in path lengths of light for a structure, for example, does not result in large variations of an amount of light being absorbed.

Figure 2:
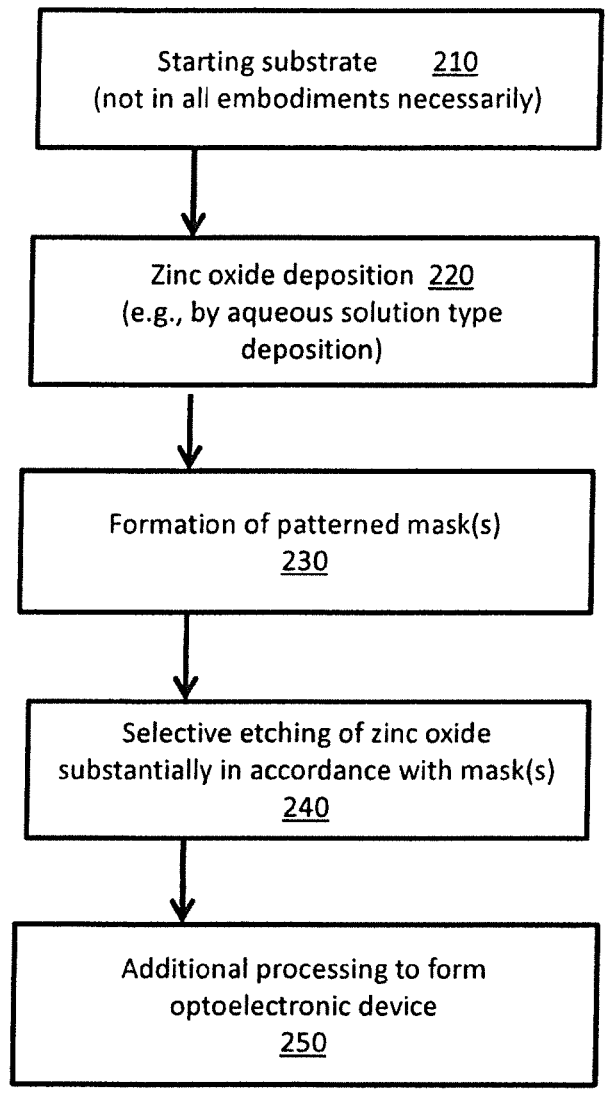
FIG. 2 is a flowchart of an embodiment of a process for fabricating a zinc oxide transparent conductive structure embodiment.
Figure 3:
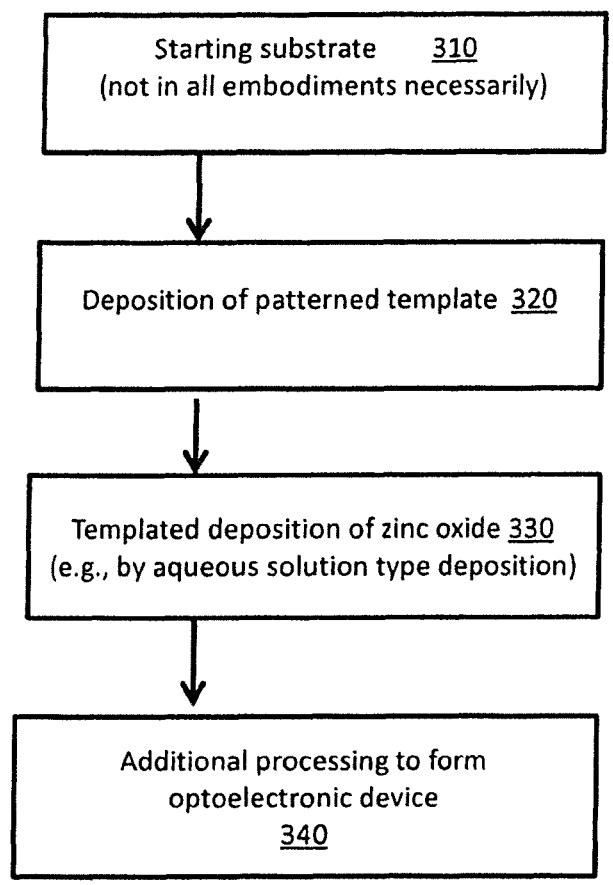
FIG. 3 is a flowchart of another embodiment of a process for fabricating a zinc oxide transparent conductive structure embodiment.

For example, in Lester, U.S. Pat. No. 8,729,580, issued May 20, 2014, a structured metal oxide layer is placed on an ITO current spreading layer of a light emitting diode (LED) to enhance light extraction, such as shown in FIGS. 2, 3, and 5 of that patent. In Lester, the ITO layer is employed to perform electrical current spreading and current injection operations. The structured metal oxide layer is performing light extraction. Likewise, in Farmer, et al., U.S. Pat. No. 8,183,575, issued May 22, 2012, an ITO layer is described as being etched to provide thicker regions for better current spreading and thinner regions for more light passage. For, ITO, however, a thickness of 250 nm may be an upper limit for practical device applications due at least in part to optical absorption. Thus, ITO may be limited to at best providing only the simplest geometries, such as a thick layer or a thin layer, for example.

However, more complex three-dimensional transparent conductive structures could potentially be useful in connection with an optoelectronic device, such as, for example, to direct current along specific paths, to enhance light extraction and/or to enhance light capture capability. For light extraction and/or light capture, in a transparent conductive structure, for example, it may be useful for a feature of the structure to have a thickness, for a dimension normal to the structure surface, exceeding wavelength for a relevant range of light, e.g., a thickness greater than from approximately 400 nm to approximately 700 nm for a visible light spectrum. Areas of greater thickness may also be beneficial for device architecture reasons unrelated to current distribution or light extraction/capture, e.g. to have a feature of a transparent conductive structure extend past another feature of a device, for example. However, as mentioned, ITO of relatively greater thicknesses may be less desirable, in some situations, at least.

In contrast, in an embodiment substantially in accordance with claimed subject matter, for example, a transparent conductive structure comprising zinc oxide (ZnO) may be employed. In an illustrative embodiment, for example, electrical spreading and light extraction may be accomplished in a single contiguous transparent conductive structure. In other words, in an embodiment substantially in accordance with claimed subject matter, the ITO layer and the structured metal oxide layer described by Lester may both be replaced by a ZnO transparent conductive structure so that potentially cost may be reduced, complexity may be reduced, and/or additional functionality may be provided, for example, relative to a conventional transparent conductive layer, such as using ITO.

Along similar lines, as described above, for some embodiments substantially in accordance with claimed subject matter, for example, a ZnO transparent conductive structure may similarly utilize regions of variable ZnO thickness in a geometric configuration, for example, to improve current spreading. However, in an embodiment, ZnO may be deposited in a manner, as described herein, for example, that is typically more transparent than ITO. Thus, thicker ZnO may be used and still allow more light passage, e.g., without significantly increasing optical absorption, by comparison. For example, a thickness of 500 nm would be more likely to be on the low end of a range of interest for ZnO in a transparent, conductive structure.

Thus, in an embodiment, for example, substantially in accordance with claimed subject matter, it may be more feasible with ZnO to form more complex three dimensional structures, such as including one or more three dimensional features, rather than merely forming relatively simple transparent conductive layers of "thinner" and/or "thicker" oxide material, such as, for example, as described by Farmer. Again, a ZnO transparent conductive structure, in an embodiment, may not only allow for similar capabilities and/or benefits as Lester and Farmer; in an embodiment, such a transparent conductive structure, for example, it potentially may also further reduce cost, further reduce complexity in terms of fabrication, and/or provide additional functionality, such as relative to a conventional transparent conductive layer of ITO, for example.

In this context, a zinc oxide crystal comprises a material primarily of zinc and oxygen atoms arranged at least partially in a crystalline phase (e.g., a crystal structure) for zinc oxide, such as, for example, the Wurtzite crystal structure. A zinc oxide crystal may contain atoms other than zinc and oxygen in a manner in which those atoms substitute for a zinc or oxygen atom in a crystal structure and/or reside in interstitial regions of a crystal structure. A zinc oxide crystal may likewise contain atomic vacancies, dislocations, and/or other crystal defects, as well as inclusions of second phases. In general, if fabricating ZnO crystals, crystals may be produced that are referred to herein as dense; however, likewise, crystals may be produced that are not dense. In this context, a dense crystal refers to a crystal structure having few measurable or few substantial defects in the lattice arrangement of a crystal structure (e.g., having only a negligible amount thereof). As a non-limiting illustration, non-dense zinc oxide crystals may be produced by a fabrication process, such as described, for example, in U.S. patent application Ser. No. 14/341,700, by J. J. Richardson and E. C. O'Hara, titled "FABRICATION AND/OR APPLICATION OF ZINC OXIDE CRYSTALS WITH INTERNAL (INTRA-CRYSTALLINE) POROSITY," filed on Jul. 25, 2014.

Zinc oxide comprises a wide band-gap semiconductor material. In various forms, it has desirable properties, including electrical-type and/or optical-type properties, as shall be described in more detail. As a consequence, an ability to fabricate one or more ZnO crystals into a geometrically complex three dimensional (3D) transparent conductive structure may potentially be of use in many current and/or future applications, again, such as, for example, optoelectronic device applications, as described herein, for example.

From the foregoing, as a non-limiting example, a device application where ZnO materials are of growing importance is as an alternative to indium tin oxide (ITO), such as has been used to form transparent conductive layers, for example. Energy generation technologies (e.g., photovoltaic solar cells) and/or energy conservation technologies (e.g., light emitting diode (LED) devices and/or organic light emitting diodes (OLED) devices), as merely examples, may utilize transparent conductive layers (e.g., as electrodes). Optoelectronic devices and/or device applications that use transparent conductive layers, such as those just mentioned, however, may further benefit from use of materials that may provide additional features beyond being transparent and conductive. For example, a transparent conductive structure of zinc oxide may be employed to, in effect, manage aspects and/or features of light passing into and/or out of a device and/or manage aspects and/or features of electrical current passing into and/or out of a device (referred to herein respectively as "light management" and "electrical current management"). For example, in the form of a transparent conductive structure, zinc oxide may be fabricated so as to potentially affect one or more of the following: light reflection, light extraction, light capture, light guiding, light out-coupling, light in-coupling, light scattering, light diffusion; and/or electrical current guiding, electrical current spreading, electrical current distribution, electrical current injection, electrical current diffusion (e.g., light management and/or electrical current management, respectively).

In this context, increased light capture and/or similar terms are intended to mean an increase in the fraction of light captured, such as by passing through a surface and/or entering though a surface and being absorbed in a device, for example, such that features and/or aspects thereof may be modified so as to potentially and/or ultimately affect properties of the light. Thus, in addition to affecting an amount of light captured, distribution of spectral and/or directional aspects of light that is captured, as examples, may be affected. Furthermore, in this context, increased light extraction and/or similar terms are intended to mean an increase in the fraction of light extracted, such as being extracted by passing through a surface and/or being extracted from a device though a surface, for example, such that features and/or aspects thereof may be modified so as to potentially and/or ultimately affect properties of the light. Thus, again, in addition to affecting an amount of light extracted, distribution of spectral and/or directional aspects of the light that is extracted, as examples, may be affected. In addition to light, likewise, management of electrical current may also be desirable, as alluded to above and as shall be described in more detail. For example, structures may be fabricated that may affect electrical resistance so that pathways for guiding movement of electrons may be employed to accomplish one or more beneficial effects, for example, as described herein in more detail.

Thus, light and/or electrical current management through three dimensional geometric features of a ZnO transparent conductive structure, which shall be described in more detail, may modify aspects and/or features associated with passage of light and/or electrical current into or out of a device, such as an optoelectronic device. As mentioned, an ability to incorporate transparent conductive properties and/or additional, which may include enhanced, electrical-type and/or optical-type properties, into a single transparent conductive structure has potential, for an optoelectronic device, for example, to reduce manufacturing complexity, manufacturing cost, and/or potentially to improve operating performance.

As an example, in an embodiment, manufacturing of zinc oxide into a transparent conductive structure may be achieved by various "top-down" fabrication methods otherwise used, for example, to fabricate other types of semiconductor integrated circuit devices. In this context, "top down" refers to a type of patterning that employs bulk deposition of a material followed by selective removal of portions, such as by selective etching. For example, selected area wet etching or selected area dry etching methods to pattern previously deposited zinc oxide via a mask material may be one approach. A pattern may, for example, be formed in mask material by photolithographic methods. A mask may comprise a photoresist material, for example. Wet-etching of ZnO is known and may utilize inorganic acids (e.g., nitric, hydrochloric, phosphoric, etc.), organic acids (e.g., acetic, citric, etc.), bases (e.g., NaOH, KOH, $NH_4OH$, etc.) and/or solutions of ammonium salts (e.g., $NH_4Cl$, etc.).

Dry etching of ZnO is also known, if not as commonly practiced, and may use various plasma etching techniques (e.g., reactive ion etching (RIE), inductively coupled plasma etching (ICP), etc.) with various reactive gas chemistries, for example. Furthermore, multi-layered patterns may be fabricated by multiple masking and/or etching processes. As described herein, shaping via a patterned structure may be achieved by etch conditions that may result in relatively smoothly sloped and/or curved surfaces (e.g., walls) in an embodiment. For example, a known etching technique may be employed to at least partially affect anisotropy of etching and/or at least partially affect selectivity of etching for ZnO relative to etching of mask material.

In another fabrication approach, however, a "bottom up" template type fabrication process may be used. An aqueous solution type deposition process may, as an example, be employed to fabricate an embodiment of a three dimensional transparent conductive structure of ZnO that may be otherwise challenging to fabricate via, for example, vapor deposition methods. As shall be described, "bottom up" refers to a type of patterning employing selective deposition in particular locations, rather than bulk deposition followed by selective removal in particular locations, the latter of which occurs with an etching type fabrication process. In a template-type fabrication approach, for example, a template structure may be employed to cover surface locations in which zinc oxide is not to be deposited. That is, a template structure that has been deposited may block or inhibit deposition of zinc oxide with respect to surface locations that are covered by portions of the template structure. Thus, a template allows zinc oxide to be selectively deposited in exposed surface areas not covered by the template. Zinc oxide growth may then be extended from these areas, but may be constrained, at least in part, to template structure openings, for example, in an embodiment, although being constrained in this fashion is not necessarily required in general.

High-level illustrations of example embodiments of patterning by a "top-down" etching-type fabrication method and by a "bottom-up" template-type fabrication method are shown respectively in FIGS. 2 and 3. It is noted, of course, that claimed subject matter is intended to not be limited to examples provided for purposes of illustration. Nonetheless, in these example illustrations, a surface of a "starting substrate," such as illustrated by blocks 210 and 310, respectively, may comprise unstructured ZnO or structured ZnO, such as may have been patterned by a previously performed top-down or bottom-up process, for example. Thus, in an embodiment, "top-down" and "bottom-up" processes for fabrication may be combined in series to create more complex transparent, conductive structures, as described herein.

A comparison of FIGS. 2 and 3 illustrates differences in approach. For example, in FIG. 2, as is commonly done in other micro-fabrication technologies, a bulk deposition of zinc oxide, at block 220, may be followed by formation of a patterned mask, at block 230, and selective etching of zinc oxide substantially in accordance with the patterned mask, at block 240. However, in FIG. 3, by comparison, before deposition of zinc oxide, a patterned template is deposited, at block 320, followed by selective, templated deposition of zinc oxide, substantially in accordance with patterned template openings, such as at block 330. While not shown in FIG. 3, explicitly, as alluded to previously, prior to deposition of a patterned template, a bulk deposition of zinc oxide may have taken place on which additional zinc oxide is to be deposited in a selective pattern, such as by using a template. For both of these illustrations, as shown by blocks 250 and 340 respectively, it is intended that a three dimensional transparent conductive structure of ZnO be fabricated for use in an optoelectronic device. A variety of beneficial properties, such as spreading current (e.g., electrical-type properties) as well optical-type uses, may be realized.

Thus, an embodiment substantially in accordance with claimed subject matter may include, as examples, methods for forming, and devices utilizing, zinc oxide in a three-dimensionally patterned transparent conductive structure. In an illustrative embodiment, a transparent conductive structure may be formed at least in part from zinc oxide via aqueous solution type deposition.

In an embodiment, a fabricated transparent conductive structure may, for example, provide a thickness that varies in a dimension substantially normal to a device surface, such as in a specified pattern that varies as a function of position in an (e.g., substantially horizontal) x, y plane. Likewise, in an embodiment, a transparent conductive structure of zinc oxide may possess sufficient physical connectivity (e.g., be sufficiently contiguous) to distribute current over a desired area and/or along desired pathways within the structure. For example, zinc oxide may form a contiguous structure on, in or over an optoelectronic device so that electrical current may be transported to and/or from a contact, such as a metal contact, for example, across an area of the device surface. It is noted, as described in more detail later, a geometric pattern of zinc oxide in a transparent conductive structure embodiment may be of a form that cannot adequately be described as simply "thicker" or "thinner" (e.g., as presence or lack of presence of zinc oxide at a given position), in comparison with Lester and/or Farmer, previously cited. For example, in an embodiment, as mentioned, zinc oxide may form a transparent conductive structure having a thickness that varies as a function of position in a substantially horizontal plane.

As was mentioned, applications, such as optoelectronic device applications, that typically use transparent conductive layers, including photovoltaic type solar cells and/or LED/OLED type lighting, as non-limiting examples, may benefit from a transparent conductive structure, such as of ZnO, to perform and/or assist in performance of light and/or current management. Although techniques to produce these properties in a separate layer are known, as discussed previously with respect to Lester and Farmer, for example, in general, a variety of disadvantages may exist, such as optical absorption for ITO of certain thicknesses, as one example.

By comparison, for a transparent conductive structure of ZnO, in some embodiments, one or more aspects of reflection, transmission and/or absorption of electromagnetic radiation, including light, incident to one or more fabricated zinc oxide crystals, may be beneficially affected at least partially by a resulting three-dimensional (3D) structure that has a geometrically complex configuration, such as resulting from patterning. Furthermore, in some embodiments, transport of electrons may also be beneficially affected. Likewise, optical scattering may be affected. In some situations, relatively high optical scattering may, for example, be desirable. Relatively high scattering may be desirable, for example, to diffusely scatter electromagnetic radiation, such as light, including visible light. Otherwise, light may be absorbed back into an optoelectronic device, such as via total internal reflection, propagation of guided modes and/or for other reasons, potentially adversely affecting device efficiency and/or performance. Thus, scattering may be employed in some devices to improve device efficiency and/or performance. For example, for an optoelectronic device, such as a light emitting diode (LED) or an organic light emitting diode (OLED), relatively high scattering, such as via a transparent conductive structure embodiment, may allow more light to be emitted out of the device, to thereby potentially increase efficiency and/or performance.

An embodiment of a method of fabricating one or more ZnO crystals may employ an aqueous solution type deposition process, as described herein. In general, processes for fabricating one or more ZnO crystals, such as examples discussed herein, are currently known. Thus, as discussed, ZnO may initially be bulk deposited, although not necessarily required. As previously described, it may be etched or additional zinc oxide may be selectively direct deposited by using a template-type fabrication process.

In an embodiment, a method of fabricating a transparent conductive structure comprising zinc oxide, such as for an optoelectronic device, may be substantially in accordance with the following. A patterned layer may be formed on zinc oxide that overlays a semiconductor substrate, such as zinc oxide previously bulk deposited to form a layer. In general, the term substrate refers to an underlying layer or substance. (It is noted the FIGS. 20 and 21 do not have a layer labelled as a substrate simply because the semiconductor layers provide a substrate for the zinc oxide formed). The patterned layer formed may comprise one of a patterned template layer or a patterned mask layer. If the patterned layer comprises a patterned mask layer, selective etching of the previously deposited zinc oxide may be employed. If the patterned layer comprises a patterned template layer, selective deposition by an aqueous solution type process on previously deposited zinc oxide, substantially in accordance with template openings, for example, may be employed. Selective etching or selective deposition, as described, may, for example, be employed to fabricate a transparent conductive structure of ZnO having one or more three dimensional geometric features to provide additional, including enhanced, electrical-type and/or optical-type properties, such as for an optoelectronic device that is to include the transparent conductive structure, in an embodiment.

Figure 10:
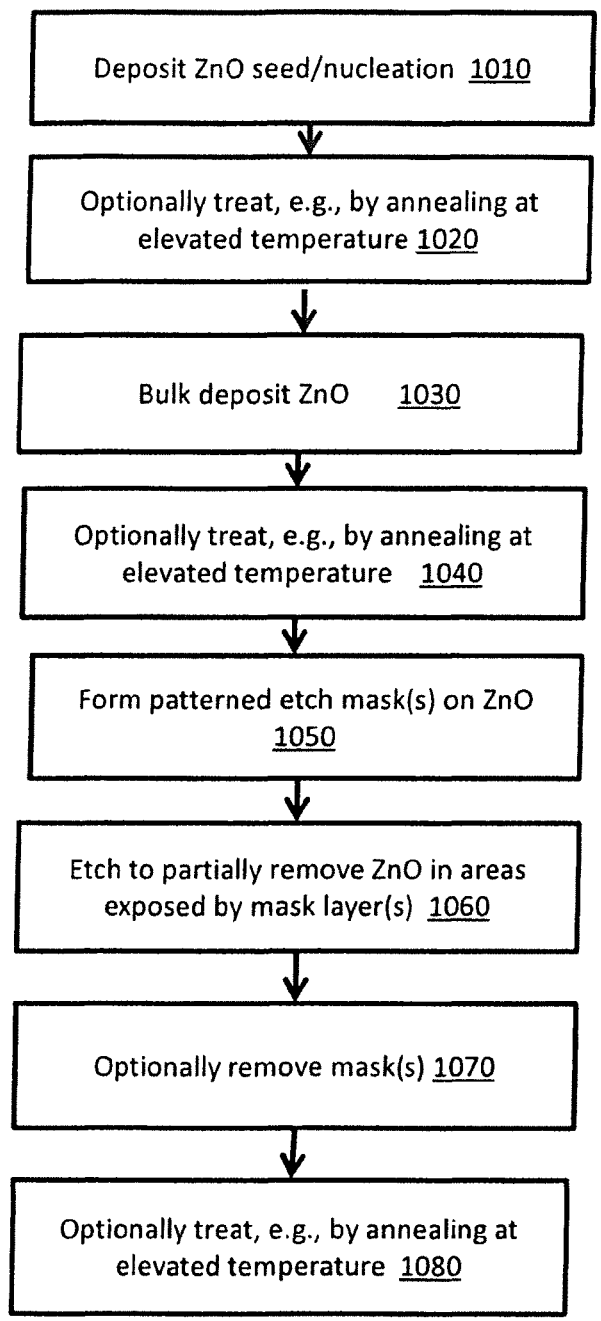
FIGS. 10 and 11 are flowcharts of additional embodiments, respectively, of a process for fabricating a zinc oxide transparent conductive structure embodiment.
Figure 11:
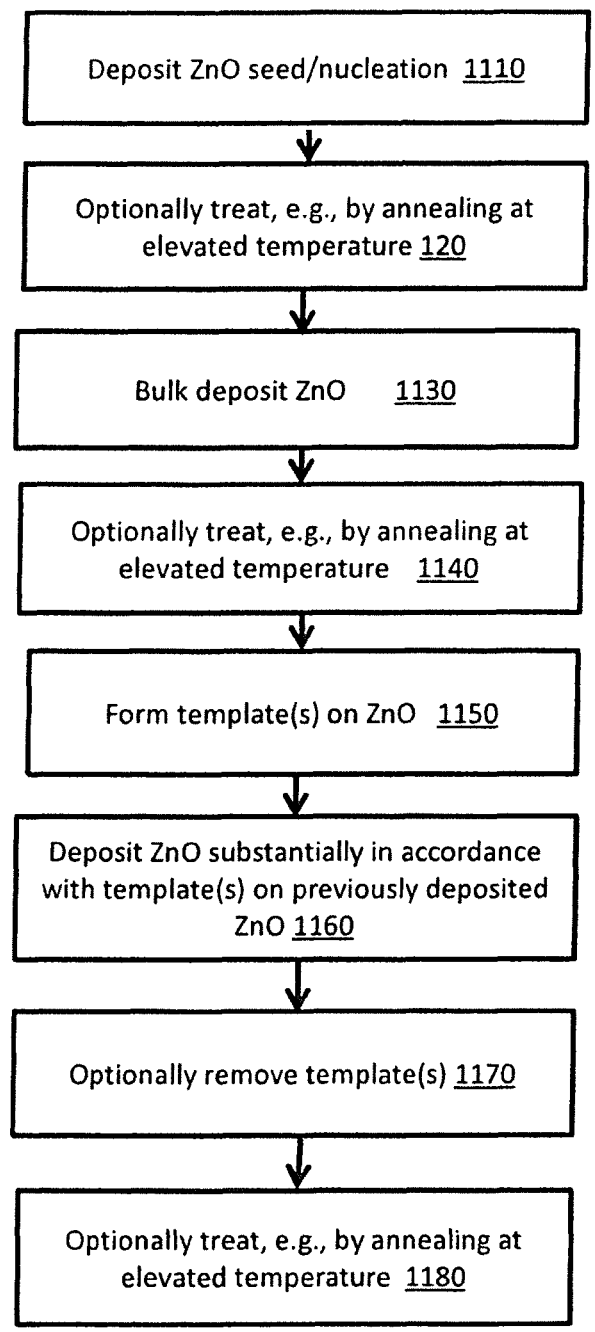

FIGS. 10 and 11 are flowcharts respectively illustrating in more detail embodiments of processes for fabrication of a zinc oxide transparent conductive structure. FIG. 10 illustrates an etching type fabrication embodiment and FIG. 11 illustrates a template type fabrication embodiment. Thus, in these illustrative embodiments, a fabrication process may comprise synthesizing one or more zinc oxide crystals at least partially in an aqueous solution.

For example, FIGS. 10 and 11, respectively, are shown to employ operations illustrated by blocks 1010, 1020, 1030 and 1040 and by blocks 1110, 1120, 1130, and 1140. The following discussion provides details associated with such operations, including seeding/nucleation and bulk deposition (respectively with optional annealing, if desired), although, as noted, various other approaches to forming zinc oxide are also possible. Thus, FIGS. 10 and 11 are merely non-limiting illustrative examples. For example, it is to be understood that blocks 1010 and 1110 are intended to represent any process for forming ZnO, which may comprise without loss of generality, as examples, an aqueous seed layer deposition process, a non-aqueous seed layer process (e.g., vapor deposition), a nucleation stage process, etc.

Thermodynamic calculations disclosed in "Controlling Low Temperature Aqueous Synthesis of ZnO: Part 1, Thermodynamic Analysis," by Jacob J. Richardson and Frederick F. Lange, Cryst. Growth Des. 2009, 9(6), pp. 2570-2575, (hereinafter "Part 1") predict that aqueous solutions containing ammonia and in a certain pH range may have higher solubility for ZnO at room temperature (e.g., 25 degrees C.) than at near boiling temperatures (e.g., 90 degrees C.). Likewise, figures included in Part 1 show results of ZnO solubility calculations made as a function of pH, ammonia concentration, and temperature. For example, as suggested, these figures indicate that ZnO solubility is expected to be lower at 90 degrees C. than at room temperature.

Likewise, experimental results disclosed in "Controlling Low Temperature Aqueous Synthesis of ZnO: Part II, A Novel Continuous Circulation Reactor," by Jacob J. Richardson and Frederick F. Lange, Cryst. Growth Des. 2009, 9(6), pp. 2576-2581 (hereinafter "Part 2"), demonstrate that predictions in Part 1 appear reasonably accurate for ZnO synthesized from solutions containing between approximately 0.25 and approximately 1.0 mol/L ammonia and having pH between approximately 10 and approximately 12, for example. Of course, example conditions, such as these, are understood to be merely illustrative of a host of possible other conditions, including other pH and/or other ammonia concentration solution conditions, capable of synthesizing ZnO. See also, U.S. Pat. No. 8,668,774, by J. Richardson and F. Lange, titled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS," issued on Mar. 11, 2014.

In an illustrative example, an aqueous growth solution may contain dissolved zinc, ammonia and/or another source of similarly acting complexing ligands, and an acid or base to achieve a desired pH. It may also at times be desirable to simplify fabrication processes for formation of ZnO; thus, acids and bases which do not form complexes with zinc under particular pH and/or temperature conditions may be used, for example.

Zinc may be supplied to a growth solution in a variety of ways, including by dissolving a zinc containing compound, in this context referred to as a zinc nutrient. A zinc nutrient may comprise a soluble zinc salt, such as, for example, zinc nitrate. With higher solubility of ZnO at room temperature than at higher temperatures, ZnO may itself be employed as a zinc nutrient for ammonia containing solutions of appropriate pH, as disclosed in Part 1 and Part 2.

Besides ammonia, other sources of ammine ligands, as well as other ligands which may result in a similar ZnO solubility, for example, may be employed as well. In this context, ammine refers to a ligand in a metal complex containing at least one ammine (—NH3) ligand. Aqueous solutions of ammonia dissolved in water are also commonly referred to as an ammonium hydroxide solution, ammonia water, aqua ammonia, household ammonia, and/or simply ammonia. Ammine ligands may also be supplied to an aqueous solution by dissolving ammonium salts. Examples include, but are not limited to, simple inorganic and/or organic salts, such as ammonium chloride, ammonium nitrate, ammonium acetate, ammonium carbonate, triammonium citrate, etc. Ammine ligands may also be supplied as part of a soluble coordination compound or double salt. Additionally, ammine ligands may be supplied by in situ decomposition of another compound, such as urea and/or hexamine, for example. Other ligands which may form aqueous complexes of Zn (II) may result in a temperature range of decreasing solubility of ZnO with increasing temperature and may, therefore, also be used. Other ligands with potential to behave in this manner include, but are not limited to, water soluble primary amines, secondary amines, tertiary amines, and/or polyamines. Non-nitrogen containing ligands which form complexes and result in desired solubility behavior for ZnO may potentially also be used.

In addition to the foregoing, it is, of course, also possible to use more complex growth solutions containing additives to modify ZnO growth and/or composition. Additives, such as citrate ions, are known to affect morphology with respect to ZnO synthesized in an aqueous solution. For example, citrate ions may be utilized in a growth solution through addition of soluble metal citrate salts and/or citric acid. Examples of other additives that may show similar behavior include other poly-anionic molecules, surfactants, water soluble polymers, and/or biomolecules, for example.

Additives may also be employed in a growth solution to potentially affect a synthesized composition of ZnO. As a few non-limiting examples, additions, for example, may include sources of group III elements, such as Al, Ga, or In, which are known to provide N-type doping to ZnO. Others include group I elements, such as Li, which are known to reduce conductivity of ZnO, and/or isovalent elements, like Mg and/or Cd, which are known to have a potential to modify bandgaps with respect to ZnO if used as dopants.

Addition of dopant additives, such as those mentioned above, could be achieved by dissolving a soluble dopant containing chemical. For example, Al may be supplied by a solution of Al nitrate. Similar to the way that ZnO may be utilized as a zinc nutrient, addition of dopant additives may also be achieved by dissolving generally low solubility dopant containing chemicals under appropriate dissolution conditions. In this context, dissolution condition refers to a situation in which the free energy for the dissolution reaction is negative so that dissolution takes place. For example, an aluminum oxide powder could be mixed with a ZnO powder in an applicable dissolution condition. A third method could be to dope a zinc nutrient before using it, e.g., using an Al doped ZnO powder as a nutrient. The second and third methods have an advantage of maintaining a concentration of dopant in solution throughout growth. However, if a small amount of dopant is being incorporated into ZnO relative to solution concentration, solution concentration may not change significantly, and the first method may also work satisfactorily.

Referring now to FIGS. 10 and 11, as shown, such as by blocks 1010, 1030, 1110, and 1130, in a first part (e.g., 1010 and 1110 respectively for FIGS. 10 and 11), a seed layer may be deposited or nucleation of ZnO may occur, and in a second part (e.g., 1030 and 1130 respectively for FIGS. 10 and 11), a thicker ZnO film may be grown. For example, a zinc oxide film may be grown from an aqueous solution using a two-part process, such as has been described in: Andeen, D.; Kim, J. H.; Lange, F. F.; Goh, G. K. L; Tripathy, S., Lateral Epitaxial Overgrowth of ZnO in Water at 90° C. Advanced Functional Materials 2006, 16, (6), 799-804; and in Thompson, D. B.; Richardson, J. J.; Denbaars, S. P.; Lange, F. F., Light Emitting Diodes with ZnO Current Spreading Layers Deposited from a Low Temperature Aqueous Solution. Applied Physics Express 2009, 2, 042101-042101.

As suggested previously, a variety of processes may be employed to form ZnO. Likewise, a variety of approaches to form a seed layer are also possible and claimed subject matter is not limited in scope to a particular approach. For example, one approach is described in U.S. Pat. No. 8,796, 693, by J. Richardson, D. Estrada, E. O'Hara, H. Shi, C. Shin, and Y. Yoon, titled "SUCCESSIVE IONIC LAYER ADSORPTION AND REACTION PROCESS FOR DEPOSITING EPITAXIAL ZNO ON III-NITRIDE-BASED LIGHT EMITTING DIODE AND LIGHT EMITTING DIODE INCLUDING EPITAXIAL," issued on Aug. 5, 2014; likewise, another approach is described in U.S. patent application Ser. No. 14/537,487, by J. J. Richardson, E. C. O'Hara, and D. Estrada, "SOLUTION DEPOSITION METHOD FOR FORMING METAL OXIDE OR METAL HYDROXIDE LAYER," filed on Nov. 10, 2014. As a non-limiting example, for seed layer deposition, a substrate, such as a single MgAl2O4 wafer or an epitaxial GaN layer on a single crystal sapphire wafer, for example, may be used. Continuing, however, in an example approach, a liquid precursor solution may be used with a substrate, the precursor solution comprising an oxide of a metal, a hydroxide of the metal, or a combination thereof, dissolved in an aqueous ammonia solution. The precursor solution may be evaporated to directly form a solid seed layer, the seed layer comprising an oxide of the first metal, a hydroxide of the first metal, or a combination thereof. After seed layer deposition, and subsequent annealing (optionally, as shown by blocks 1020 and 1120 respectively for FIGS. 10 and 11), a second growth part may be employed, such as by inserting a substrate with a seed layer into an aqueous solution of zinc nitrate, sodium citrate, and aqueous ammonia, and heating, for example, from room temperature to 90° C. Again, as shown by blocks 1040 and 1140, respectively, for FIGS. 10 and 11, optionally, annealing may likewise be employed with respect to a second growth part, in an embodiment.

Nucleation and subsequent growth of a thicker ZnO film may also be achieved in a single-part aqueous solution type deposition process. For example, relatively high nucleation and growth rates may be achieved via essentially one operation by using microwave heating of an aqueous growth solution, as described in Richardson, J. J. and Lange, F. F., "Rapid Synthesis of Epitaxial ZnO Films from Aqueous Solution Using Microwave Heating." Journal of Materials Chemistry 2011, 21, 1859-1865. If one or more ZnO crystals are provided for deposition of ZnO, homoepitaixial nucleation, which typically occurs with relatively low supersaturation (referred to as 'growth' in this context), may take place with no specific aqueous solution process feature or condition necessarily differentiating nucleation from growth. For example, ZnO growth may occur on one or more ZnO crystals inserted into an aqueous growth solution, in which the one or more zinc oxide crystals may be of arbitrary form synthesized by an arbitrary method.

A rate of ZnO synthesis may potentially be affected by a variety of factors (e.g., process parameters), such as solution composition, circulation rate, volume, temperature, and/or rate of temperature change, etc. Process parameters, such as these examples, may potentially be modified; these parameters are mentioned in the context of effect on rate of synthesis, potentially in connection with fabrication of ZnO crystals, such as in a variety of forms (e.g., epitaxial film, particle, bulk body, etc.) independent of other potential fabrication considerations (such as crystal imperfection, for example).

Thus, for an embodiment, guidelines for selecting conditions for a process to fabricate ZnO, such as in different forms, may be based at least in part on the foregoing. For example, if growing a bulk single crystal, a supersaturation rate may desirably be kept relatively low so as to reduce risk of a secondary nucleation and dendritic growth, which may occur at fast growth rates and may potentially lower crystal quality. Likewise, forming an epitaxial film, such as on a substrate may imply an at least initially higher supersaturation rate to initiate nucleation, such as via a seed layer forming operation, followed by a lower supersaturation rate to facilitate more quality for single crystal film growth. Although not necessarily particularly important with respect to fabrication of an optoelectronic device, as an example, synthesis of ZnO nanowires on a substrate may involve a lower nucleation density than a film so as to reduce risk of growing connections between wires, but a higher supersaturation rate after nucleation so as to promote 1-dimensional growth. As another example, although, again, not necessarily related to fabrication of an optoelectronic device, synthesis of free nanoparticles may involve a relatively high supersaturation rate so as to initiate nucleation of many particles, but supersaturation may be dropped after nucleation so as to reduce risk with respect to further growth. Thus, a variety of approaches are possible and are intended to be included within claimed subject matter.

As previously indicated, example processes, such as those just described, may be formulated to produce zinc oxide crystals. For example, a ZnO crystalline structure may be created in one or more embodiments, in which conditions used for ZnO crystal synthesis, along with conditions used in subsequent treatment of one or more ZnO crystals (e.g., post-synthesis treatment, such as annealing), may produce one or more resulting ZnO crystals. As has been indicated previously, claimed subject matter relates to fabrication of one or more zinc oxide crystals including appropriate post-synthesis treatment (e.g., annealing) in a manner so as to provide a ZnO transparent conductive structure embodiment having additional, including enhanced, electrical-type and/or optical-type properties, such as than is provided by a conventional transparent conductive layer, if made using ITO, as an example.

Although many state of the art processes to manufacture zinc oxide, in general, typically comprise vapor phase processes that are likely to produce zinc oxide, such as dense zinc oxide; a relatively low temperature process (e.g., 20-100 degrees C.), for example, such as one of the illustrative examples described previously, may be employed to produce one or more zinc oxide crystals, for an embodiment. As a non-limiting illustration, one or more single zinc oxide crystals may be formed, for example, at least as one of the following forms: an epitaxial film; a single crystal film; a single crystal particle; a bulk single crystal, or an array or a pattern of micro- or smaller dimensioned single crystal structures. Although claimed subject matter is not limited in scope in this respect, a particle may typically be less than 100 microns, whereas a bulk crystal may typically be greater than 100 microns. Likewise, one or more polycrystalline bodies may also be formed, for example, at least one as of the following forms: a polycrystalline film; a polycrystalline particle; a bulk polycrystalline body, or an array or pattern of micro- or smaller dimensioned polycrystalline structures. Of course, depending at least partially on embodiment particulars, different processes may be employed to fabricate different physical forms and/or geometries.

It is well established that zinc oxide may be produced by multiple types of solution crystal growth and/or deposition techniques, including process illustrations described herein, for example. Likewise, relatively low temperature aqueous solution type methods for synthesizing zinc oxide, such as in the form of nanostructures, particles, polycrystalline films, epitaxial films, and/or bulk single crystals, are known. As described in more detail herein, however, process embodiments typically may include various modifications to otherwise known approaches so as to fabricate a transparent conductive structure with additional, including enhanced, electrical-type and/or optical-type properties.

Referring again to FIGS. 10 and 11, in an embodiment, three-dimensionally patterned zinc oxide may be formed by deposition of zinc oxide from aqueous solution, on at least some areas of a substrate (as a non-limiting example) followed by employing patterned mask(s) or patterned template(s), which may cover some areas and may expose other areas of the previously deposited zinc oxide, and then, for example, either:

Process 1: depositing zinc oxide selectively on previously deposited areas of zinc oxide left exposed (e.g., by mask(s) or template(s)) so as to form a zinc oxide structure having areas of different thicknesses, or;

Process 2: removing deposited zinc oxide selectively from areas left exposed (e.g., by mask(s) or template(s)), for example, by an etching method, but without necessarily completely removing the entire thickness of zinc oxide deposited previously in at least some of those areas, so as to form, for example, a zinc oxide structure having areas of different thicknesses.

These operations are respectively illustrated by examples shown in FIGS. 10 and 11 (e.g., blocks 1050, 1060 and 1070 for FIG. 10 and blocks 1150, 1160 and 1170 for FIG. 11).

In an embodiment, mask(s) or template(s) may be formed at least in part using an organic or polymeric material, for example, such as photoresist. A mask or template formed of photoresist may, for example, be directly patterned by photolithography. A mask or template material may also be formed at least in part using an inorganic material in an embodiment. For example, a template or mask may be formed using an oxide or nitride, such as silicon dioxide or silicon nitride, or metal. In an embodiment, mask(s) or template(s) previously formed may be removed, such as following use, or alternately, may remain part of a structure being fabricated. Likewise, modifications to otherwise suit a desired final transparent conductive structure or desired final device structure may be made.

In an embodiment, a transparent conductive structure may be formed from zinc oxide that has been initially deposited epitaxially and subsequently grown, as previously described. A transparent conductive structure embodiment may comprise zinc oxide deposited epitaxially on a substrate comprising a Wurtzite crystal structure III-N single crystal or on an epitaxial Wurtzite crystal structure III-N layer (which may, in an embodiment, for example, be disposed on a single crystal substrate). The III-N single crystal or epitaxial layer of the substrate may, for example, ultimately be employed to form a light emitting diode (LED), although claimed subject matter is not limited in scope to sample illustrations, such as this latter example.

Continuing with these example embodiments, nonetheless, again, referring to FIG. 10, blocks 1050-1060 illustrate etching methods, such as selected area wet etching or selected area dry etching methods, to pattern previously deposited zinc oxide via mask material, such as previously described. A pattern may be formed in mask material, for example, by photolithographic methods, for block 1050. Mask(s) (e.g., mask layer(s)) may comprise photoresist material, for example. Wet-etching of ZnO is known and may utilize inorganic acids (e.g., nitric, hydrochloric, phosphoric, etc.), organic acids (e.g., acetic, citric, etc.), bases (e.g., NaOH, KOH, $NH_4OH$, etc.) and/or solutions of ammonium salts (e.g., $NH_4Cl$, etc.), for example. Dry etching of ZnO is also known, and may use various plasma etching techniques (e.g., reactive ion etching (RIE), induc-tively coupled plasma etching (ICP), etc.) with various reactive gas chemistries, for example. Blocks 1050-1060 are intended to illustrate a variety of approaches, including the foregoing. Etching-type fabrication is well-known, as mentioned, and therefore, further discussion is not believed to be necessary. See, as sample illustrations of etching, "Fabrication of High Conductivity, Transparent Electrodes with Trenched Metal Bus Lines," by O. J. Gregory et al., in J. Electrochem. Soc., Vol. 138, No. 7, July 1991; US Patent Publication 20120255929, published Oct. 11, 2012; *Introduction to Microfabrication*, by Sami Franssila, published by John Wiley & Sons, Ltd., 2005.

FIG. 11 illustrates another embodiment, previously mentioned, employing template-type fabrication, particularly with respect to blocks 1150-1160. In a template-type fabrication approach, template structures (e.g., layer(s)) may be employed to cover surface locations where zinc oxide is not to be deposited, shown by block 1150. That is, templates that have been deposited may block or inhibit deposition of zinc oxide with respect to surface locations that are covered by the template(s). Thus, one (or more) template(s) allow zinc oxide to be selectively deposited in exposed surface areas not covered by the template(s). Zinc oxide growth may extend from these exposed areas, but may likewise be constrained to template openings, for example, in an embodiment.

Several approaches to producing a template pattern have been tried with satisfactory results; although, since examples provided are intended to be illustrative, it is likewise intended that other approaches that may be known or that may be developed be included within subject matter claim scope. An example of a fabrication approach capable of being employed includes colloidal crystal related technologies. For example, in M. Scharrer, X. Wu, A. Yamilov, H. Cao, and R. P. H. Chang, "Fabrication of inverted opal ZnO photonic crystals by atomic layer deposition," Appl. Phys. Lett., vol. 86, no. 15, p. 151113, 2005, using a colloidal crystal as a 3D template, ZnO deposition was accomplished using atomic layer deposition, a type of chemical vapor deposition (CVD) process. Likewise, U.S. Pat. No. 6,409,907, titled "Electrochemical Process for Fabricating Article Exhibiting Substantial Three-Dimensional Order and Resultant Article," issued to Braun et al., on Jun. 25, 2002, describes use of colloidal crystals to accomplish deposition and/or patterning of a template. Thus, a similar approach may be employed in connection with fabrication of one or more template(s), such as to implement blocks 1150-1160 of FIG. 11 for an embodiment, for example.

Another example of a fabrication approach capable of being employed includes transfer stamping-related technologies. For example, in D. Andeen, J. H. Kim, F. F. Lange, G. K. L. Goh, and S. Tripathy, "Lateral Epitaxial Overgrowth of ZnO in Water at 90° C.," Adv. Funct. Mater., vol. 16, no. 6, pp. 799-804, April 2006; and in J. H. Kim, D. Andeen, and F. F. Lange, "Hydrothermal Growth of Periodic, Single-Crystal ZnO Microrods and Microtunnels," Adv. Mater., vol. 18, no. 18, pp. 2453-2457, September 2006, using transfer stamping, template-type deposition via aqueous solution (e.g., aqueous solution type deposition) was accomplished for ZnO. Transfer stamping (also referred to as "channel stamping") was employed according to these articles to pattern a polymer, such as a photoresist, rather than patterning by photolithography. Thus, again, a similar approach may be employed in connection with fabrication of one or more template(s), to implement blocks 1150-1160 of FIG. 11 for an embodiment, for example.

Likewise, other lithographic methods besides photolithography, such as nano-imprint lithography and/or electron-beam lithography, may be employed for patterning of one or more templates. For example, J. J. Richardson, D. Estrada, S. P. DenBaars, C. J. Hawker, and L. M. Campos, "A facile route to patterned epitaxial ZnO nanostructures by soft lithography," J. Mater. Chem., vol. 21, no. 38, p. 14417, 2011, describes use of nano-imprint lithography, and K. J. Pooley, J. H. Joo, and E. L. Hu, "Constrained, aqueous growth of three-dimensional single crystalline zinc oxide structures," APL Mater., vol. 2, no. 1, p. 012111, January 2014, describes use of electron-beam lithography. Similar approaches may be employed in connection with fabrication of one or more template(s) (e.g., for patterning), such as to implement blocks 1150-1160 of FIG. 11 for an embodiment.

Figure 4A:
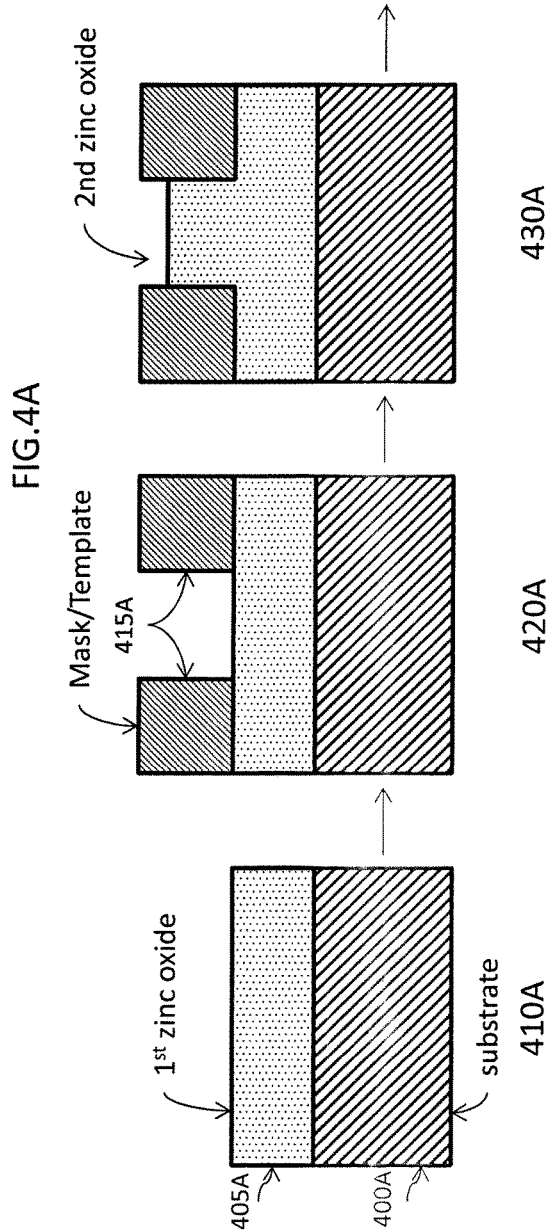
FIGS. 4A and 4B are schematic diagrams illustrating resulting structure embodiments at various points for two process embodiments provided as illustrative examples with respect to fabrication of a zinc oxide structure embodiment.
Figure 4B:
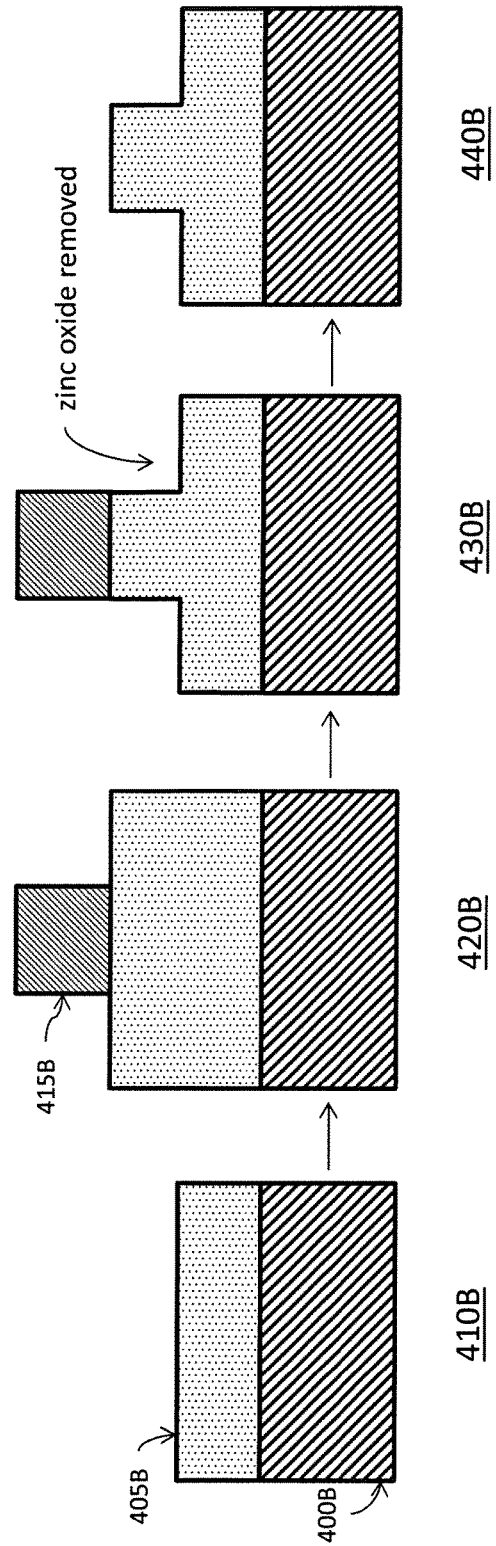
Figure 5A:
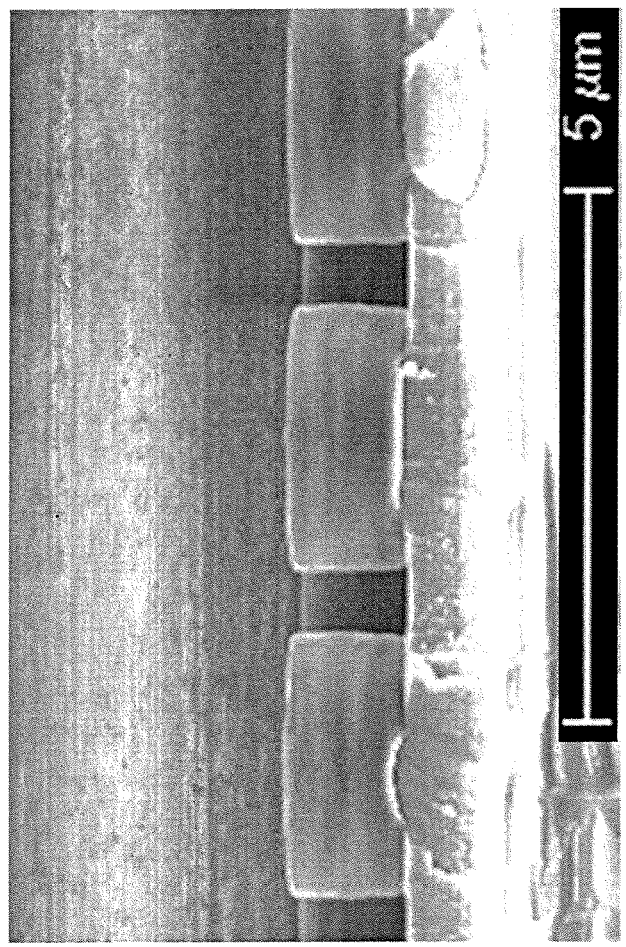
FIGS. 5A and 5B are scanning electron micrographs (SEMs) showing a fabricated zinc oxide structure embodiment.
Figure 5B:
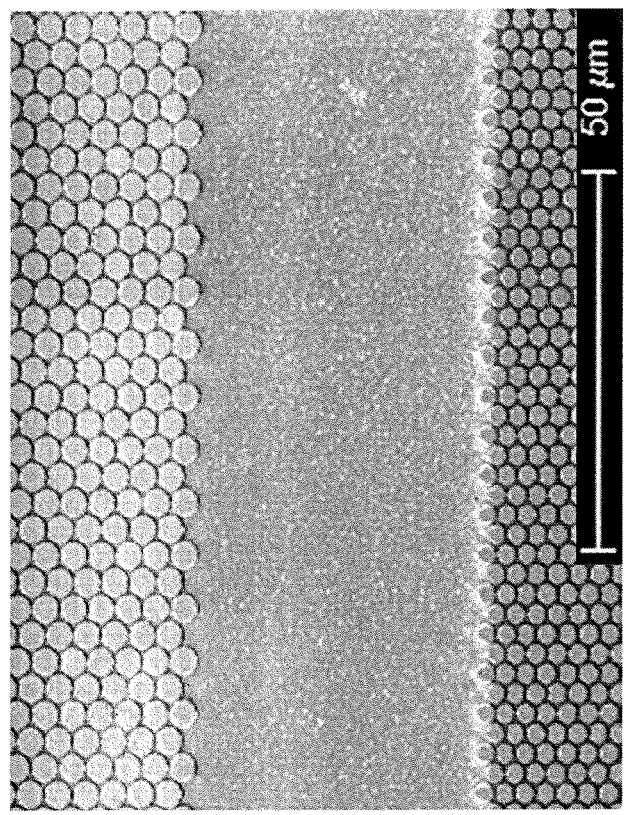

Schematic illustrations are shown respectively in FIGS. 4A and 4B and a scanning electron micrograph of a zinc oxide structure produced by example process 1 above, is shown in FIGS. 5A and 5B, shown in FIG. 5A as a side view and in FIG. 5B via plan view. Now referring to FIG. 4A, for example, an embodiment structure 410A is shown in which zinc oxide 405A has been bulk deposited on substrate 400A, such as previously described, for example. Likewise, a template 415A is deposited on zinc oxide 405A, as illustrated by structure embodiment 420A. Zinc oxide may be selectively deposited, such as described previously, for example, as a result of template 415A, shown by structure embodiment 430A. Optionally, template 415A may be removed, illustrated by structure embodiment 440A.

A different approach is illustrated, referring to FIG. 4B. For example, as shown by FIG. 4B, an embodiment structure 410B is shown in which zinc oxide 405B has been bulk deposited on substrate 400B, such as previously described, for example. Likewise, a mask 415B is deposited on zinc oxide 405A, as illustrated by structure embodiment 420B. Zinc oxide may be selectively etched, such as described previously, for example, as a result of mask 415B, shown by structure embodiment 430B. Optionally, mask 415B may be removed, illustrated by structure embodiment 440B.

Figure 6:
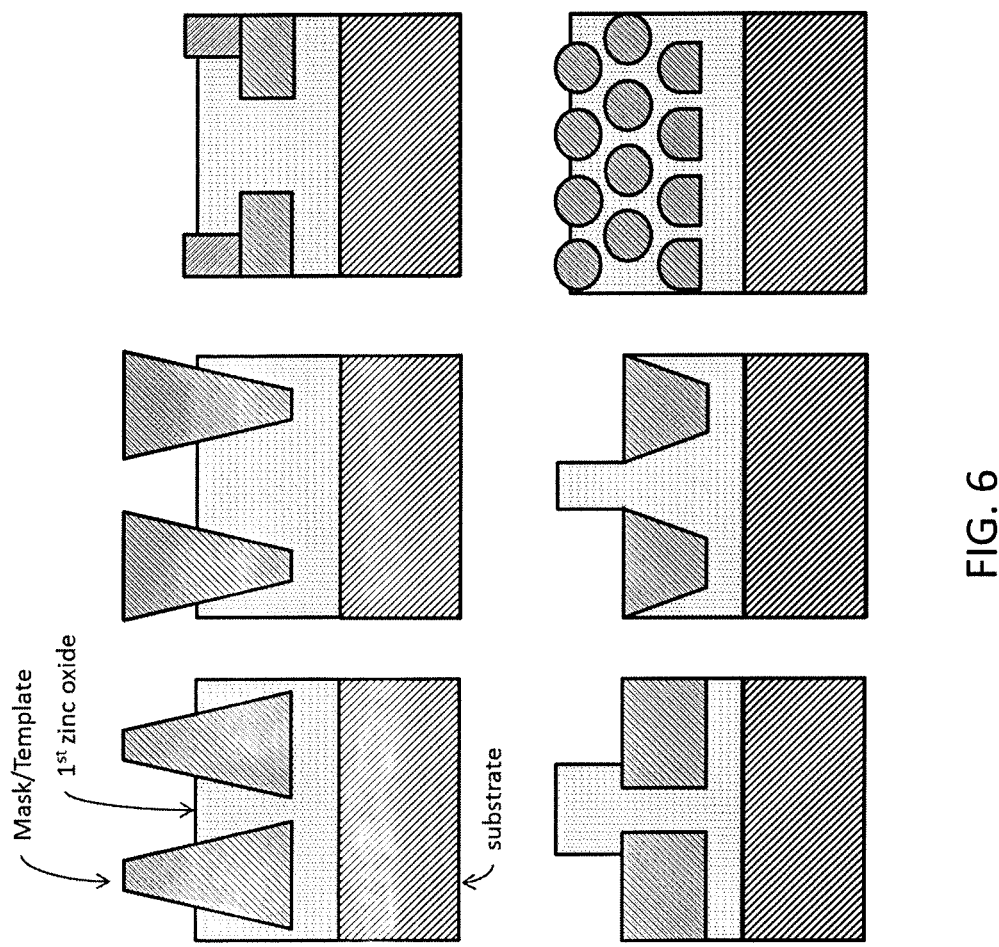
FIG. 6 are illustrative examples of various zinc oxide structure embodiments capable of being fabricated.

In an embodiment, repetition or combination of processes, such as the two processes above, for example, may be employed in any of a variety of ways, such as, in one example, in series, to form more complex three-dimensional patterns in a zinc oxide structure, such as one having non-planar and/or non-linear geometrically shaped features. To provide an initial sense for the tremendous potential variety possible, examples of a few slightly more complex three dimensional features capable of being included in an embodiment of a contiguous zinc oxide structure using a template-type (e.g., "bottom up") and/or etch-type (e.g., "top down") fabrication process are shown schematically in FIG. 6.

As previously mentioned, in some situations, it may be desirable to remove mask(s) or template(s) subsequent to use, although doing so may depend at least partially on particular materials of the mask(s) or template(s). For a photoresist or another polymeric material, referred to here as examples of "soft" material, it would be typical to chemically dissolve the soft material, which may also be referred to as "etching" or "stripping" in this context. Organic solvents may typically be used. However, as an alternative, some organic materials may be combusted, decomposed, and/or vaporized. Heating, such as in an oven/furnace, UV-Ozone exposure, and/or techniques like oxygen plasma etching/ashing may be employed. Notably, oxygen plasma etching/ashing may also be categorized as a dry etching technique. Thus, likewise, other plasma chemistries that potentially offer selectivity so that previously deposited material may be removed, while leaving ZnO intact, might be employed.

Typically, inorganic materials are characterized as "hard," rather than soft material. Thus, those materials are referred in this manner here. Examples include: metals, silicon oxide, silicon nitride, other oxides and/or other nitrides. Wet chemical dissolution of a hard material may be challenging since it is desired to not dissolve or otherwise remove ZnO while removing template and/or mask material. Thus, again, chemical combinations having a chemistry to provide selectivity of materials (e.g., removing "hard" material while not removing ZnO) might be employed, such as buffered or diluted hydrofluoric acid to remove a silicon oxide template or mask, as an example. Similarly, some dry etch (plasma) chemistries/conditions may provide desired selectivity.

In an embodiment, more complex three-dimensional patterns may also be formed using a single deposition or etch with an appropriate mask or template. Contiguous zinc oxide of a given thickness, in some embodiments, as one example, may be deposited so that a more complex three-dimensional pattern is capable of being formed while maintaining contiguity, such as to provide lateral electrical current transport and/or other desirable properties. Likewise, a more complex three-dimensional zinc oxide pattern may be formed by depositing a three-dimensionally structured template and using a single deposition to selectively deposit zinc oxide into open spaces in the template in an embodiment. Zinc oxide may, for example, be deposited selectively on previously deposited seed or bulk ZnO left exposed by a patterned template, or on areas of a substrate if applicable. A template may, therefore, in an embodiment provide an open path, such as between a surface to be covered by ZnO and a surrounding growth solution, during zinc oxide deposition. Depending at least partially on particulars of an embodiment, a template may, likewise, constrain zinc oxide deposition to the space between template regions or, as one example, if a structure being formed is to include the template, zinc oxide deposition may continue unconstrained beyond open regions of a template. Even after unconstrained growth, although potentially more challenging, a template may be removed.

Selective removal of zinc oxide using a single patterned etch may also be employed to produce more complex three-dimensional geometric features under certain conditions for an embodiment of a zinc oxide transparent conductive structure. For example, a method for etching zinc oxide which also etches mask material may be used to form a transparent conductive structure that includes three dimensional geometric features, such as sloped or curved side walls.

A technique, for example, is known in micro-fabrication in which features of a mask pattern decrease in spatial dimensions (e.g., height, width, length) over a period. Such a technique may, for example, be employed during zinc oxide etching in an illustrative embodiment. A zinc oxide surface that was protected from etching becomes progressively exposed as etching proceeds and as a mask pattern is etched away. Thus, along a dimension, zinc oxide portions that become progressively exposed later in the process (as a result of etching the mask away) are etched, but are etched less than zinc oxide portions that had been exposed to etching all along. If etching is performed until mask material is completely removed, for example, pointed or domed geometric shapes may be formed in a zinc oxide structure.

Figure 7:
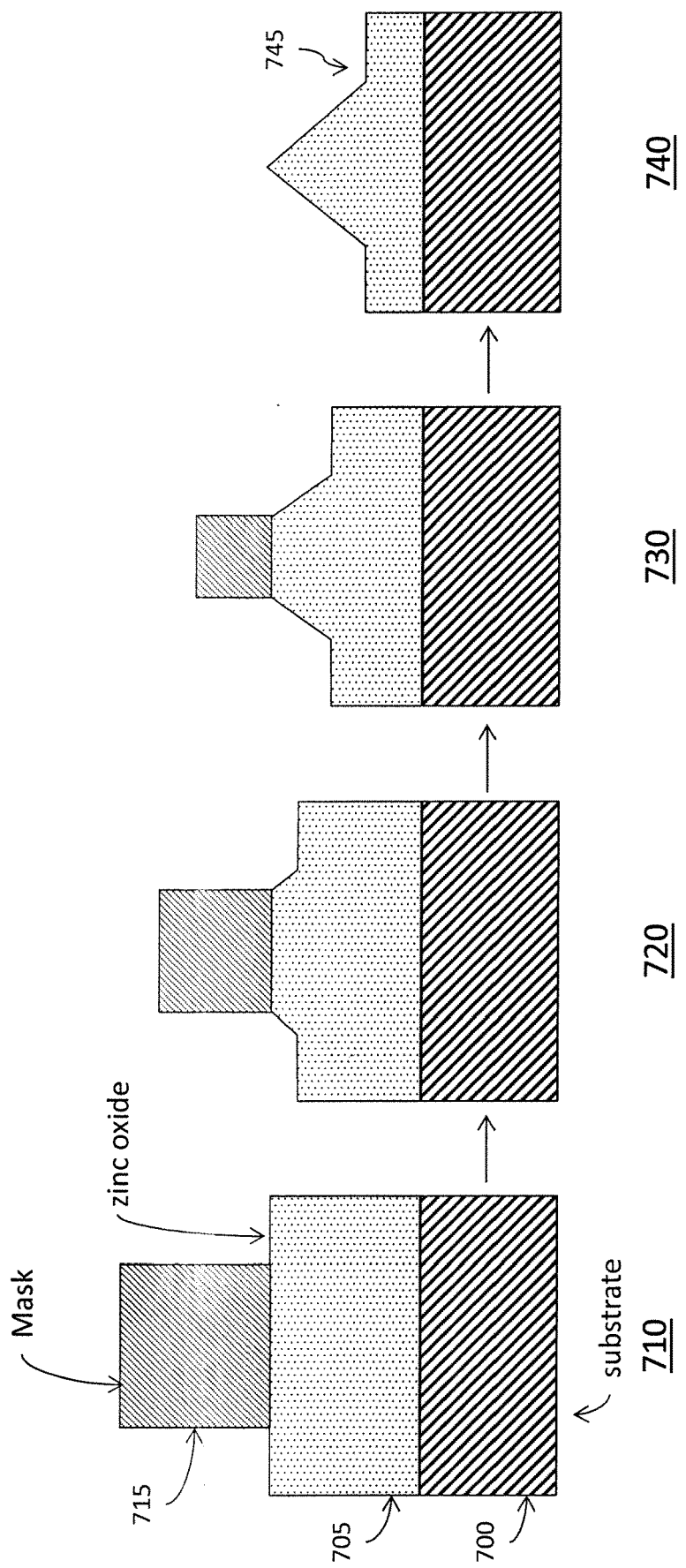
FIG. 7 are schematic diagrams illustrating resulting structure embodiments at various points for another example of a process embodiment provided as yet another illustrative example of fabrication of a zinc oxide transparent conductive structure embodiment.
Figure 8:
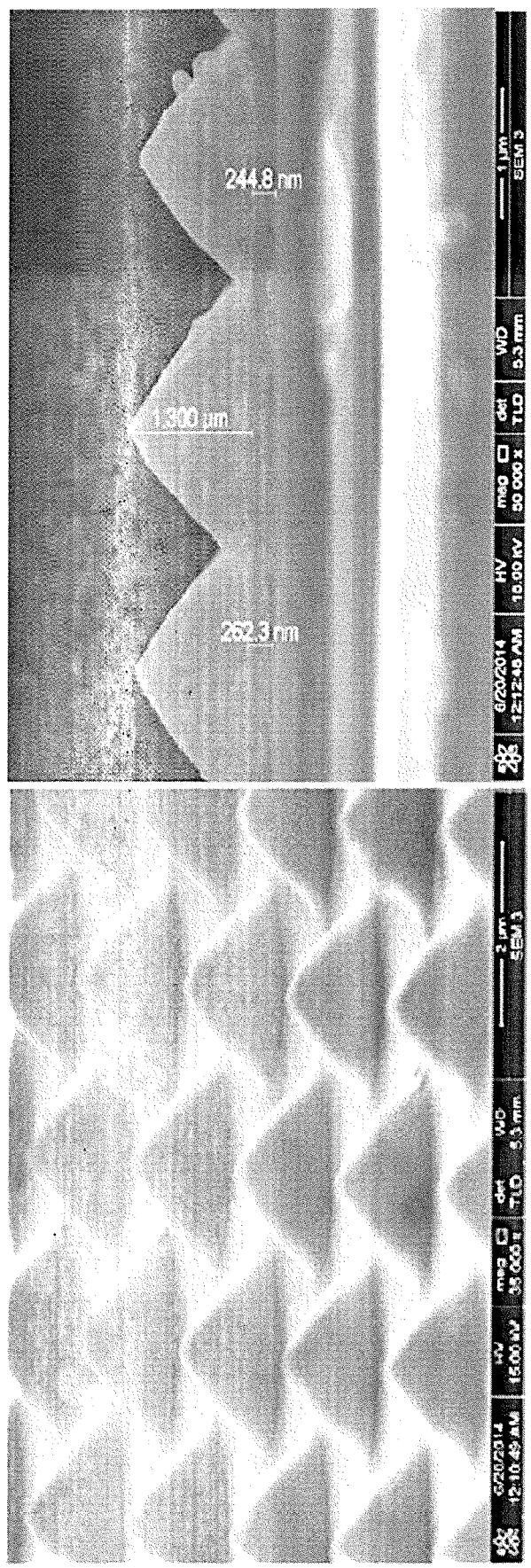
FIGS. 8A and 8B are two more scanning electron micrographs (SEMs) showing another fabricated zinc oxide structure embodiment.

As an example, a process embodiment for forming more complex three-dimensional zinc oxide features using a process that etches both zinc oxide and a mask is shown schematically in FIG. 7 and scanning electron microscope images of a zinc oxide pattern produced by this example process are shown in FIGS. 8A and 8B. Referring to FIG. 7, embodiment structure 710 is shown and illustrates a substrate 700 upon which has been deposited zinc oxide 705, such as was described herein, for example. Likewise, mask 715, as shown, also described herein, has been deposited on the zinc oxide. It is noted that some areas of the surface of zinc oxide are exposed and at least one area is covered by mask 715 in this simplified illustration.

Embodiment structure 720 illustrates changes relative to 710 from some etching having been employed. Likewise, embodiment structures 730 and 740 illustrate progressive changes with additional etching, in this example. As shown, ultimately, a structure has been formed in which zinc oxide 745 for embodiment 740 includes a dome-like feature on its surface.

A similar approach, such as, for example, with varying types of mask materials, etching materials, conditions, etc., may be employed to generate other types of geometrical features along various dimensions for embodiments of a transparent conductive structure of ZnO to provide other additional, including enhanced, beneficial properties, including optical-type properties. For example, a zinc oxide pattern may include features with a conical-like, pyramidal-like, hemispherical-like, cylindrical-like, spherical-like, elliptical-like, parabolic-like, hyperbolic-like, rectangular-like or other shape that, substantially according to geometrical optics, may, for example, facilitate coupling or transmitting light into a surrounding medium from within a zinc oxide structure and/or may facilitate coupling or receiving light from a surrounding medium so that it enters a zinc oxide structure. Thus, a variety of mechanisms individually and/or in combination may be employed to at least partially control and/or affect etch anisotropy. Such approaches are generally known and need not be described in further detail here, although additional approaches (as well as additional shapes of use) may also be developed, and are likewise intended to be included within claimed subject matter.

As indicated, features of a three-dimensional pattern of zinc oxide in embodiments of a transparent conductive structure, therefore, may provide beneficial additional, including enhanced, properties relative to a conventional transparent conductive layer, including optical-type properties, such as in connection with fabrication of an optoelectronic device, for example. In an embodiment, a pattern may be formed to result in coherent or incoherent scattering of light. Scattering may, in an embodiment for example, facilitate out-coupling of light from a transparent conductive structure and/or an underlying substrate, in a situation that might otherwise produce internal reflection or guide light along an internal pathway, such as with a conventional transparent conductive layer. Embodiments to produce light scattering may, for example, possess one-dimensional, two-dimensional, or three-dimensional periodicity, or may be aperiodic. Likewise, in an embodiment, a structure may be periodic in one dimension and aperiodic in another dimension.

In an embodiment, a three-dimensional pattern of zinc oxide in a transparent conductive structure may also provide additional, including enhanced, beneficial electrical-type properties (e.g., in addition to optical-type properties, previously mentioned), relative to a conventional transparent conductive layer, such as in connection with fabrication of an optoelectronic device, for example. In an embodiment, a pattern may, for example, comprise select areas formed to provide relatively lower electrical resistance pathways for conduction of electrical current. Thus, for example, lateral variation in electrical resistance and/or variations in other directions, may be used to preferentially transport current along lower resistance pathways, in an embodiment. This could be useful, for example, to provide improved current spreading in an embodiment, such as by providing better uniformity for an LED, for example.

Likewise, for example, a three-dimensional pattern of geometric features for an embodiment of a zinc oxide transparent conductive structure may concurrently provide one or more additional (e.g., enhanced) properties, such as optical-type properties, and another one or more additional (e.g., enhanced) properties, such as electrical-type properties. This may be achieved, for example, for an embodiment structure, by including regions that provide additional (e.g., enhanced) beneficial properties (e.g., regions with enhanced optical-type properties) and separate regions that provide additional (e.g., enhanced) beneficial properties (e.g., regions with enhanced electrical-type properties).

For example, for an embodiment, a transparent conductive structure could include regions containing periodic geometric features to scatter light in a desired manner and also contain separate regions with relatively thicker or thinner features to affect electrical conductivity in desired variations. Likewise, some separate regions may in an embodiment be more or less connected, potentially affecting electrical conductivity. Likewise, different additional properties in an embodiment structure may, in effect, although occupying a common region, for example, be separated by spatial dimensions, such as one dimension having periodic spacing of thicker and thinner regions to provide coherent scattering, e.g., act as an optical grating, while concurrently providing lower electrical resistance in an orthogonal direction (e.g., a separate spatial dimension but a common region of a device).

As mentioned previously, a variety of optoelectronic devices, such as photovoltaic devices, LEDs and OLEDs, as examples, may benefit from fabrication of a ZnO transparent conductive structure embodiment capable of providing additional, including enhanced properties, such as optical-type and/or electrical-type properties. FIG. 1, for example, illustrates an embodiment 100 of an LED employing a conventional transparent conductive layer, such as using ITO, for example. Thus, layer 110 comprises ITO in this example. Furthermore, of course, examples of LEDs employing ZnO in a transparent conductive layer are also known, such as illustrated, for example, by U.S. Patent Application Serial No. 2011/0101414, by D. Thompson, J. Richardson, S. DenBaars, F. Lange, and J. H. Kim, titled "Light emitting diodes with zinc oxide current spreading and light extraction layers deposited from low temperature aqueous solution," filed on May 5, 2011.

Referring again to FIG. 1, for LED operation, a potential difference is to be generated with respect to device embodiment 100. For example, reference numeral 115 designates an anode and reference numeral 125 designates a cathode. A potential difference between anode 115 and cathode 125 will generate a potential difference across n-type semiconductor material layer 140, p-type semiconductor material layer 120, and active layer 130 since cathode 125 physically contacts n-type semiconductor material layer 140 and anode 115 physically contacts layer 110 (and layer 110 physically contacts p-type semiconductor material layer 120). Light intensity produced, in terms of number of photons, is proportional to current flux through active layer 130. Thus, a current spreading layer, such as 110, typically is included so that a substantially uniform current flux is present across a device. Otherwise, imbalance in resistances between n-type and p-type materials may result in non-uniform injection of current through the active layer.

Figure 9:
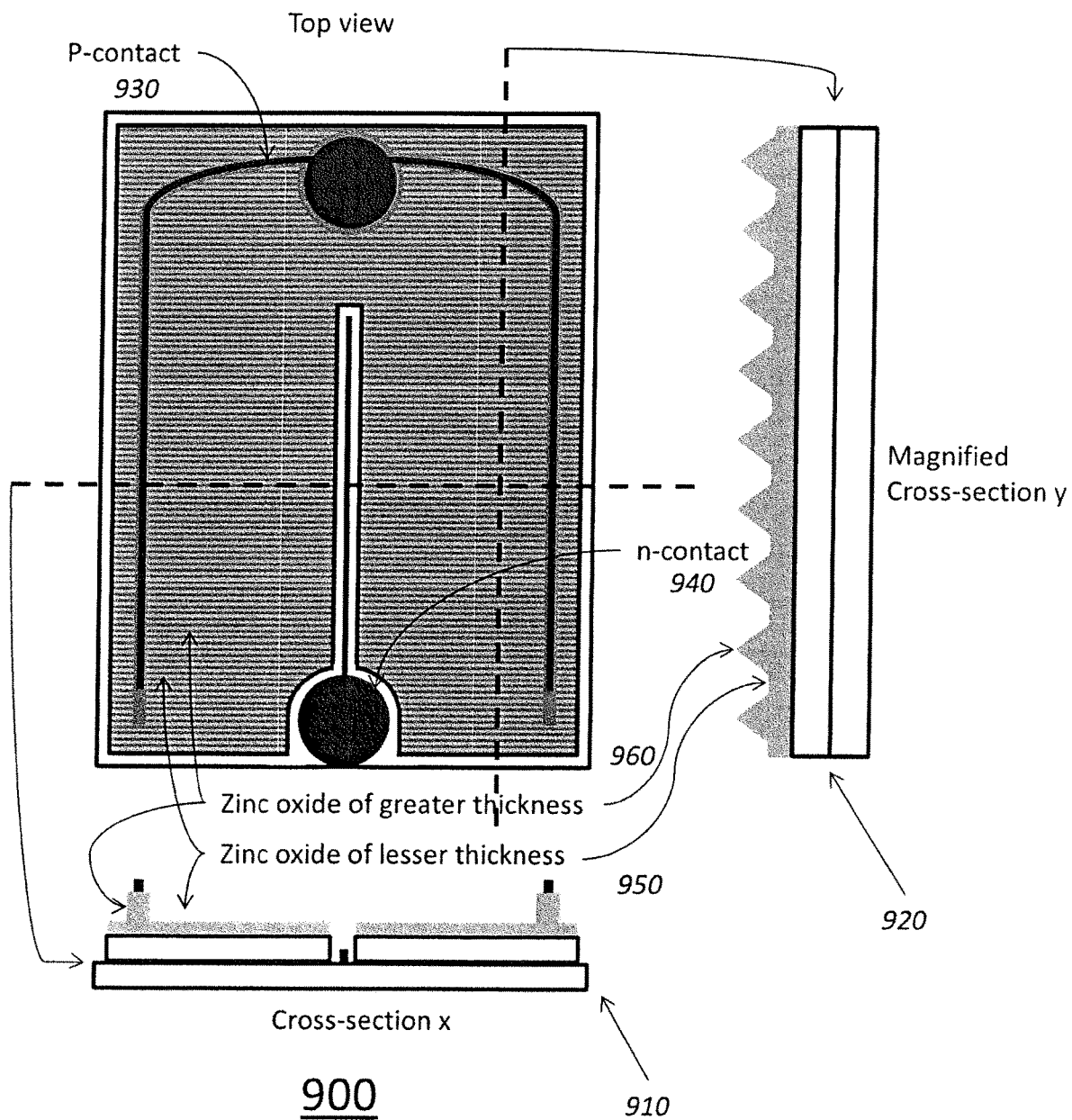
FIG. 9 is a schematic diagram of an embodiment of an optoelectronic device capable of being fabricated.

By way of contrast, FIG. 9 provides an illustrative example 900 of an optoelectronic device employing an embodiment of a ZnO transparent conductive structure having one or more three dimensional (3D) geometric features, in which the one or more features provide additional properties, such as enhanced optical type properties and/or enhanced electrical type properties. In FIG. 9, an LED embodiment is shown schematically in which lower resistance pathways, formed from areas of relatively thicker ZnO, branch off of a p-type semiconductor-side metal contact (referred to as "p contact") to reduce so called "current crowding" near the p-contact, although, of course, claimed subject matter is not limited to an illustrative embodiment. In FIG. 9, 910 illustrates a cross-section in the x direction of device example 900 and 920 illustrates a cross-section in the y direction of device example 900, both shown with dotted lines. Likewise, device example 900 includes a p-type semiconductor-side metal contact ("p-contact") 930 and an n-type semiconductor-side metal contact ("n-contact") 940.

As was discussed, zinc oxide exhibits relatively low optical absorption, such as of visible light, for example, relative to ITO. As an illustration, the absorption coefficient of zinc oxide may be less than 400 cm$^{-1}$ for wavelengths of light between about 400 nm and about 700 nm. A relatively low absorption coefficient may permit an embodiment of a conductive transparent structure to include features having dimensions that vary by greater than 500 nm without significantly affecting the amount of light absorbed. For example, even for a difference in zinc oxide thickness of greater than 500 nm, at any wavelength between about 400 and about 700 nm, for example, a difference in optical absorption would be less than approximately 2%.

Thus, referring to FIG. 9, device example 900 illustrates a III-Nitride type light emitting diode with a "mesa" type structure including an embodiment of a zinc oxide transparent conductive structure. For example, a transparent conductive structure embodiment may be fabricated by employing aqueous solution type deposition of zinc oxide. Thus, zinc oxide is deposited on the p-type III-Nitride layer surface of the light emitting diode in this example.

In this embodiment, a transparent conductive structure of zinc oxide includes a contiguous portion of a substantially uniform thickness covering the p-type III-Nitride layer surface of the light emitting diode, with additional features within the transparent conductive structure embodiment having greater zinc oxide thickness. As an example, 950 designates locations having relatively less thickness and 960 designates locations having relatively greater thickness in FIG. 9. In device example 900, additional geometric features of greater zinc oxide thickness provide additional optical-type properties, such as optical scattering, shown by an optical grating that includes features 960 illustrated by "y direction" cross-section 920. Thus, potentially greater light extraction from the device example to thereby improve device efficiency and/or performance may result. Furthermore, additional (e.g., enhanced) electrical type properties, such as lower resistance pathways in a transparent conductive structure, are able to alter distribution of current flow in a way that potentially improves LED performance.

Considerations such as the foregoing (e.g., optical type and/or electrical type properties) commonly impact structure of an optoelectronic device. In an embodiment, similar considerations may likewise potentially affect fabrication of optoelectronic devices, such as an OLED or a photovoltaic cell, as examples; thus, details regarding intended operation of a particular device may potentially affect placement within an optoelectronic device of a transparent conductive structure, for example. Along similar lines, such considerations, therefore, also have potential to affect a particular order for operations employed in connection with fabrication processes, such as timing regarding deposition and/or patterning of ZnO within an embodiment of a process of device fabrication, for example, for an optoelectronic device.

As examples, FIGS. 12-13 respectively illustrate embodiments regarding manufacture of an LED using etching-type fabrication and using template-type fabrication. On the other hand, FIGS. 14-15 respectively illustrate embodiments regarding manufacture of an OLED using etching-type fabrication and using template-type fabrication.

Thus, beginning with etch-type fabrication, FIGS. 12 and 14 may be compared. For FIG. 12, for example, an LED device embodiment 1210 includes an embodiment of a zinc oxide transparent conductive structure, shown by 1220 in the figure, over 1230, 1240, 1250, and 1260 respectively, comprising p-type layer material, active layer material, n-type layer material, and substrate. Likewise, process embodiment 1205 includes blocks 1215, 1225 and 1235, in which, respectively, ZnO is deposited on p-type layer material, a mask layer is patterned and ZnO is selectively etched, as shown. Thus, a diode, comprising semiconductor materials in a structure, in this example, is formed before fabrication involving ZnO to form a transparent conductive structure.

By way of contrast, in FIG. 14, OLED device embodiment 1410 includes ZnO, shown by 1420, over a transparent substrate, shown by 1450, and under the organic semiconductor layers, shown by 1430. Thus, it appears for this example embodiment of an OLED device, structured ZnO is fabricated before deposition of semiconductor material forming a diode. Comparison of FIGS. 12 and 14, thus, indicates that order of formation of a diode and formation of a transparent conductive structure is reversed for the respective device embodiments. Thus, while similar operations are performed, such as ZnO deposition, mask formation and selective etching, shown by 1215, 1225 and 1235 for FIG. 12 and by 1415, 1425 and 1435 for FIG. 14, in any given embodiment of a device fabrication process, timing for performance of these operations may shift relative to other operations to be performed, depending at least in part on particulars of a device embodiment to be fabricated.

Figure 15:
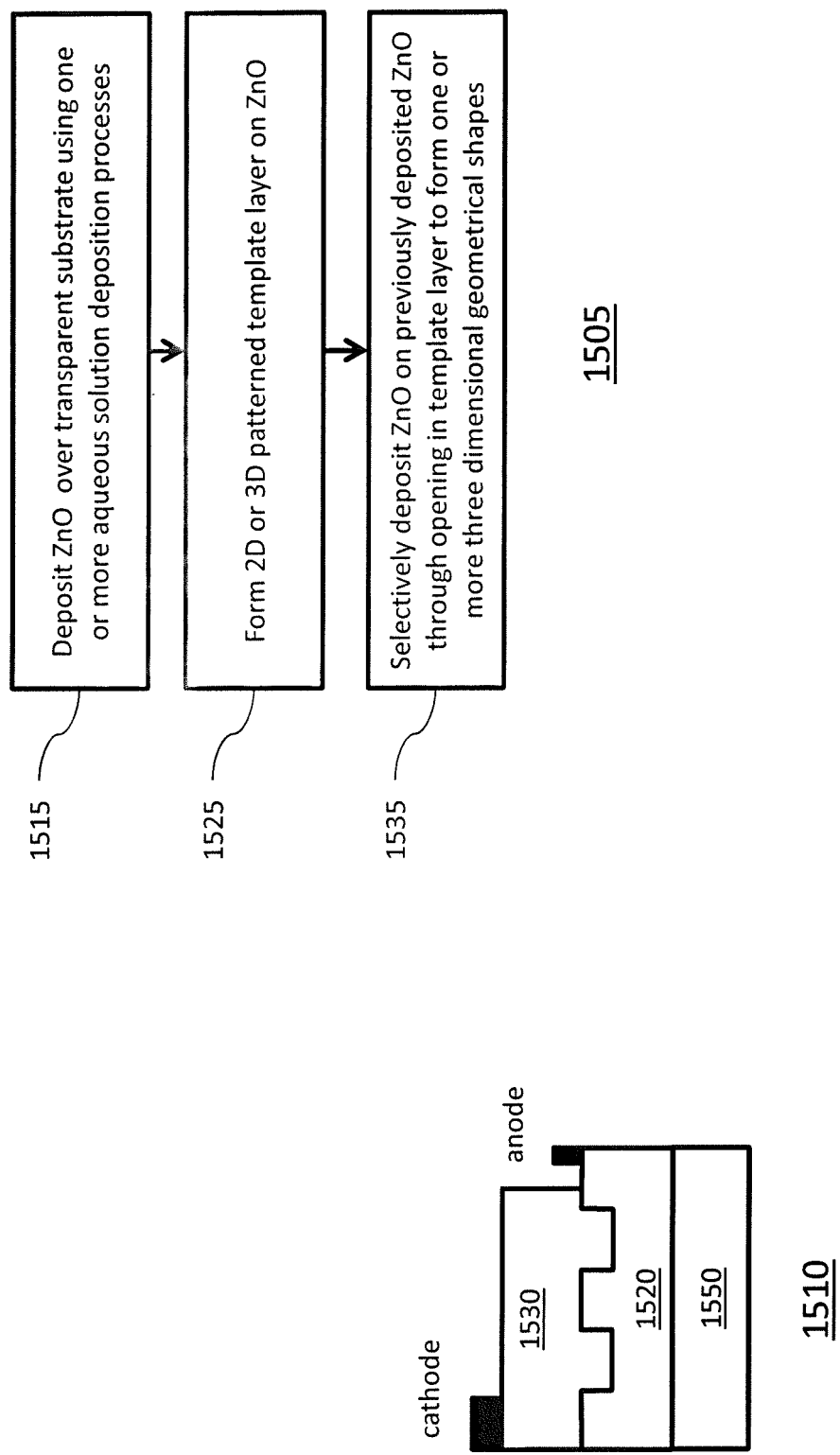
FIG. 15 is a schematic diagram of another embodiment of an OLED capable of being fabricated, including a flowchart of another associated fabrication process embodiment.
Figure 16:
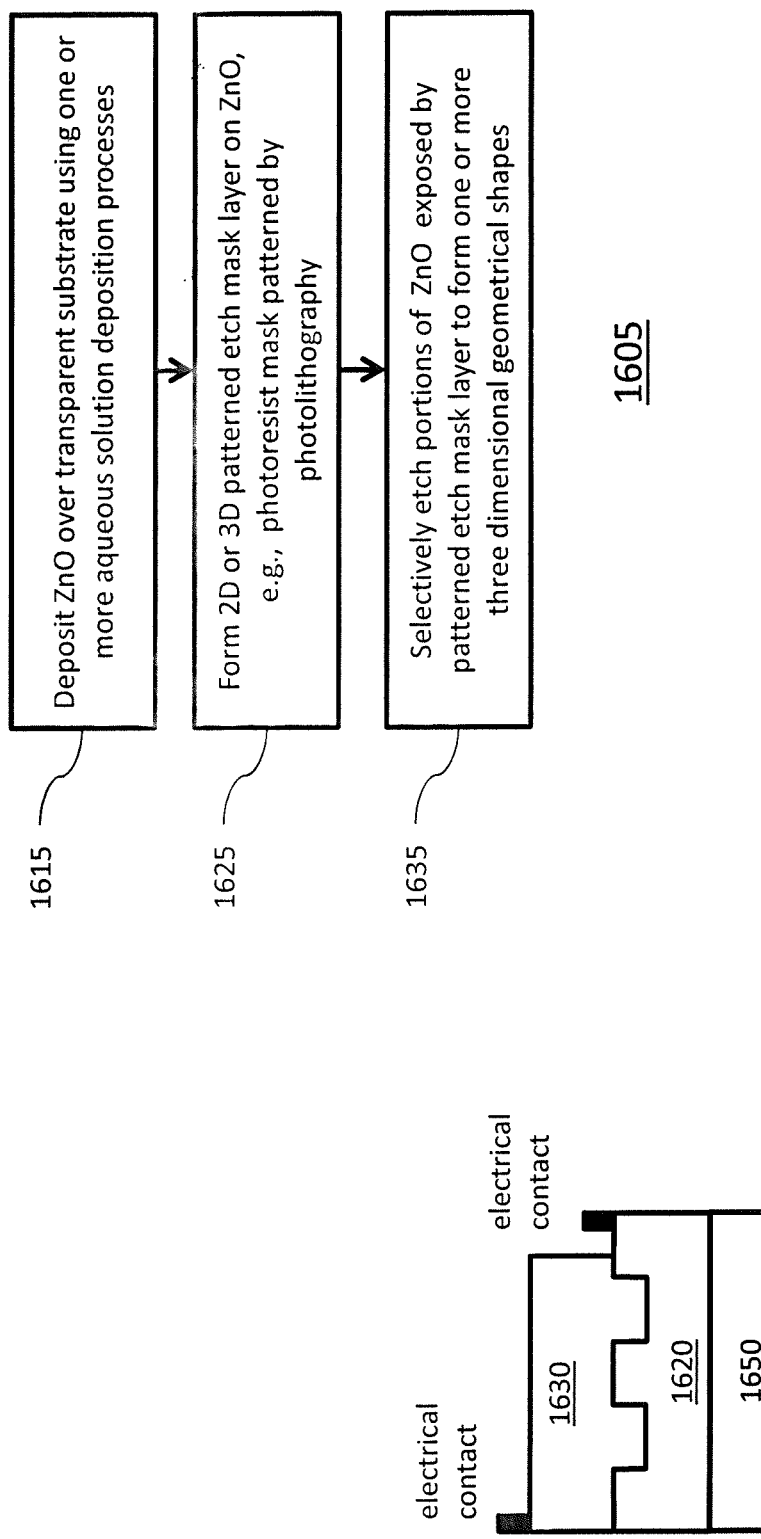
FIG. 16 is a schematic diagram of an embodiment of a photovoltaic device capable of being fabricated, including a flowchart of an associated fabrication process embodiment.
Figure 17:
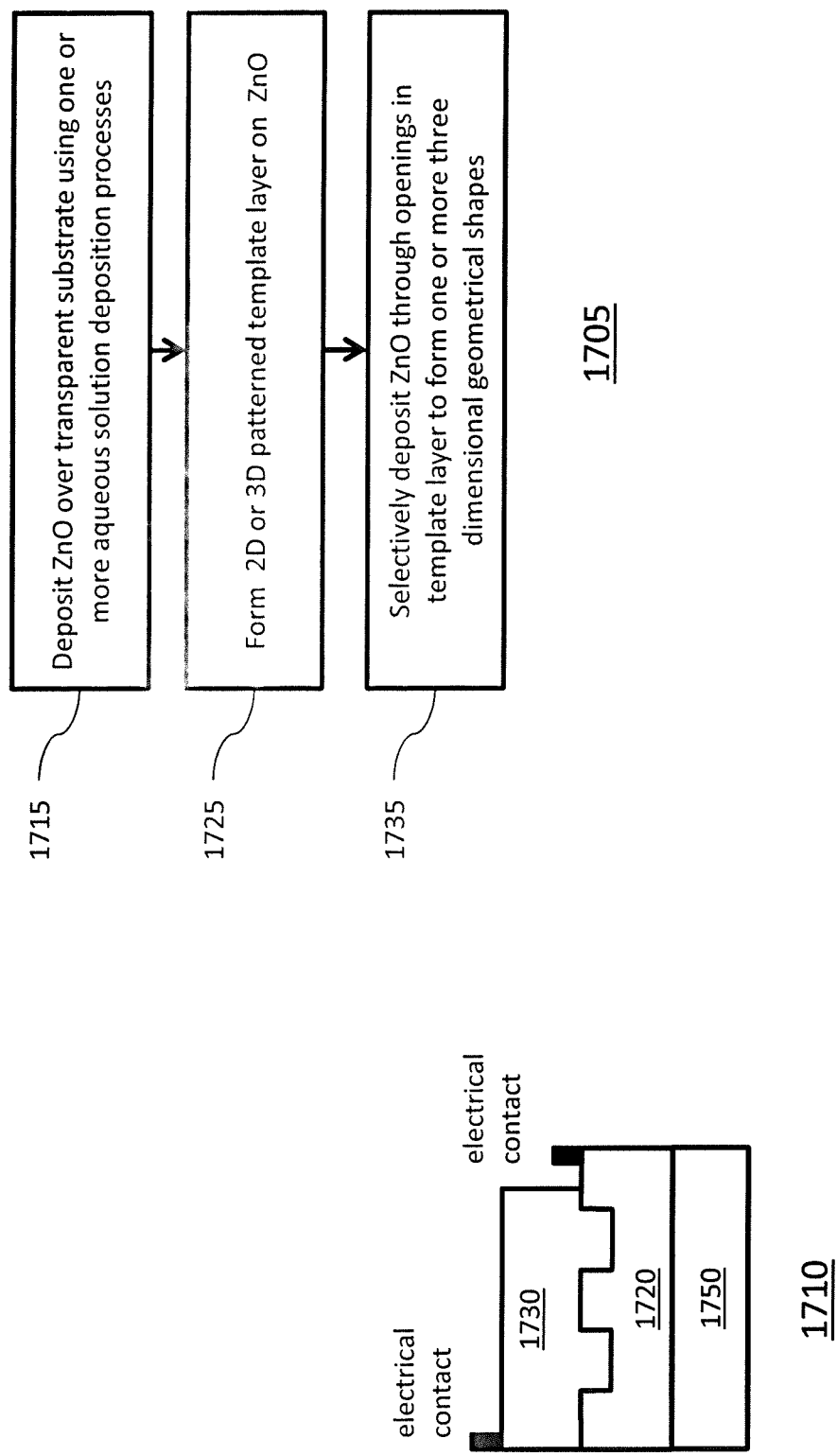
FIG. 17 is a schematic diagram of another embodiment of a photovoltaic device capable of being fabricated, including a flowchart of another associated fabrication process embodiment.
Figure 18:
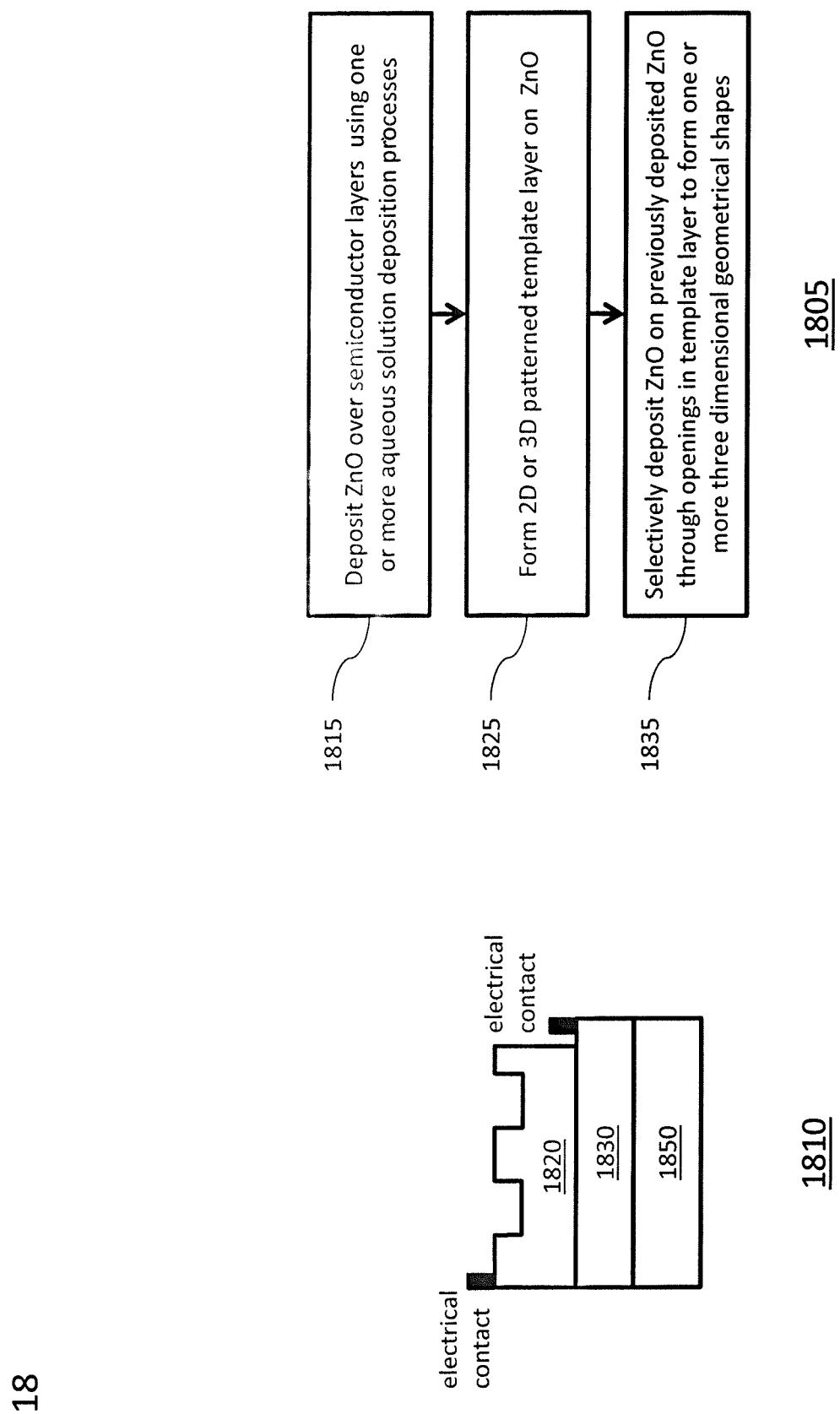
FIG. 18 is a schematic diagram of yet another embodiment of a photovoltaic device capable of being fabricated, including a flowchart of yet another associated fabrication process embodiment.
Figure 19:
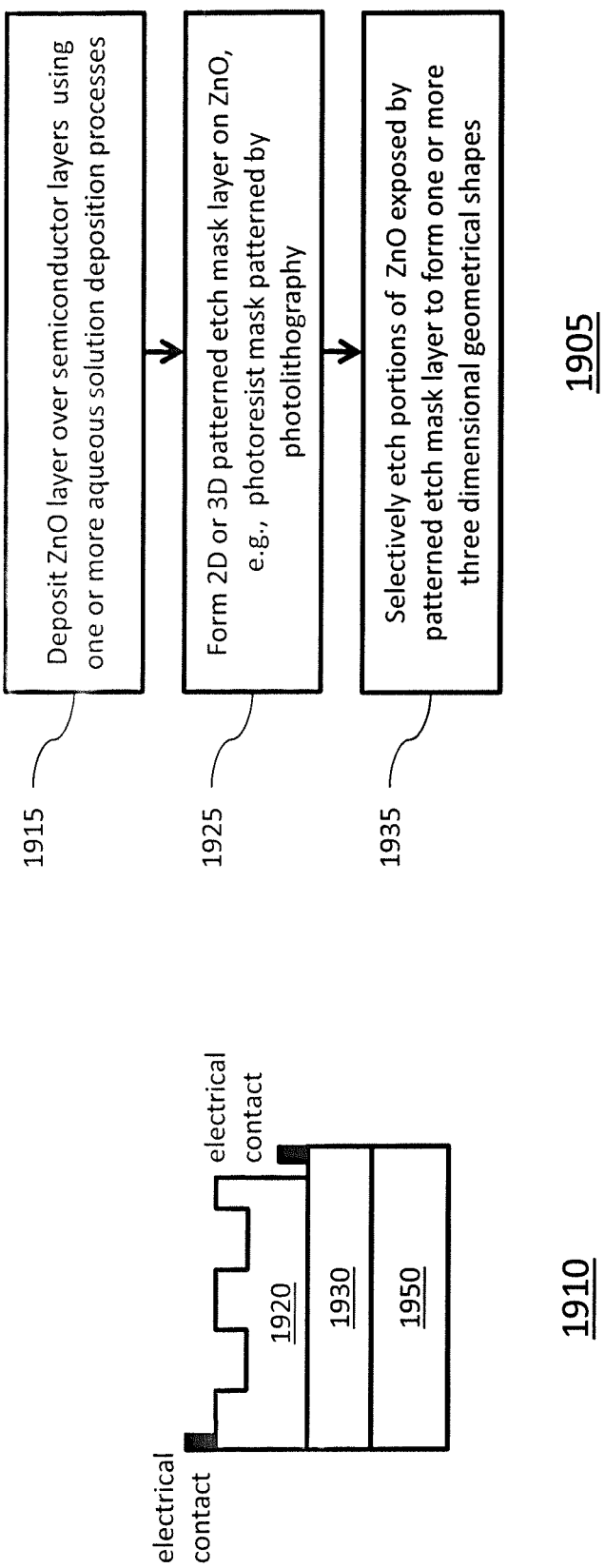
FIG. 19 is a schematic diagram of still another embodiment of a photovoltaic device capable of being fabricated, including a flowchart of still another associated fabrication process embodiment.

As might be expected, although directed to a template-type fabrication process, a comparison of FIGS. 13 and 15 leads to a similar observation, e.g., comparing device embodiment 1310 and device embodiment 1510 as well as comparing process embodiment 1305 and process embodiment 1505. A reason this might be expected is that, in an embodiment of a device fabrication process for a given device structure, template-type fabrication and etching-type fabrication appear to occur in a similar place and/or at a similar time, such as in a fabrication operation sequence, for example. That is, for a given device embodiment, other things being equal, so to speak, replacing template-type fabrication with etching-type fabrication, for example, should not result in shift of other operations in a fabrication process that is of great significance.

FIGS. 16-19 relate to fabrication of various embodiments of a photovoltaic device, shown in respective figures, and associated fabrication process embodiments. However, the discussion above with respect to FIGS. 12-15 appears useful here also. Thus, in terms of a sequence of fabrication operations, for example, FIGS. 16-17 appear analogous to the previously discussed OLED embodiments (e.g., FIGS. 14-15) and FIGS. 18-19 appear analogous to the previously discussed LED embodiments (e.g., FIGS. 12-13), which is further borne out from a close review of appropriate figures.

Figure 20:
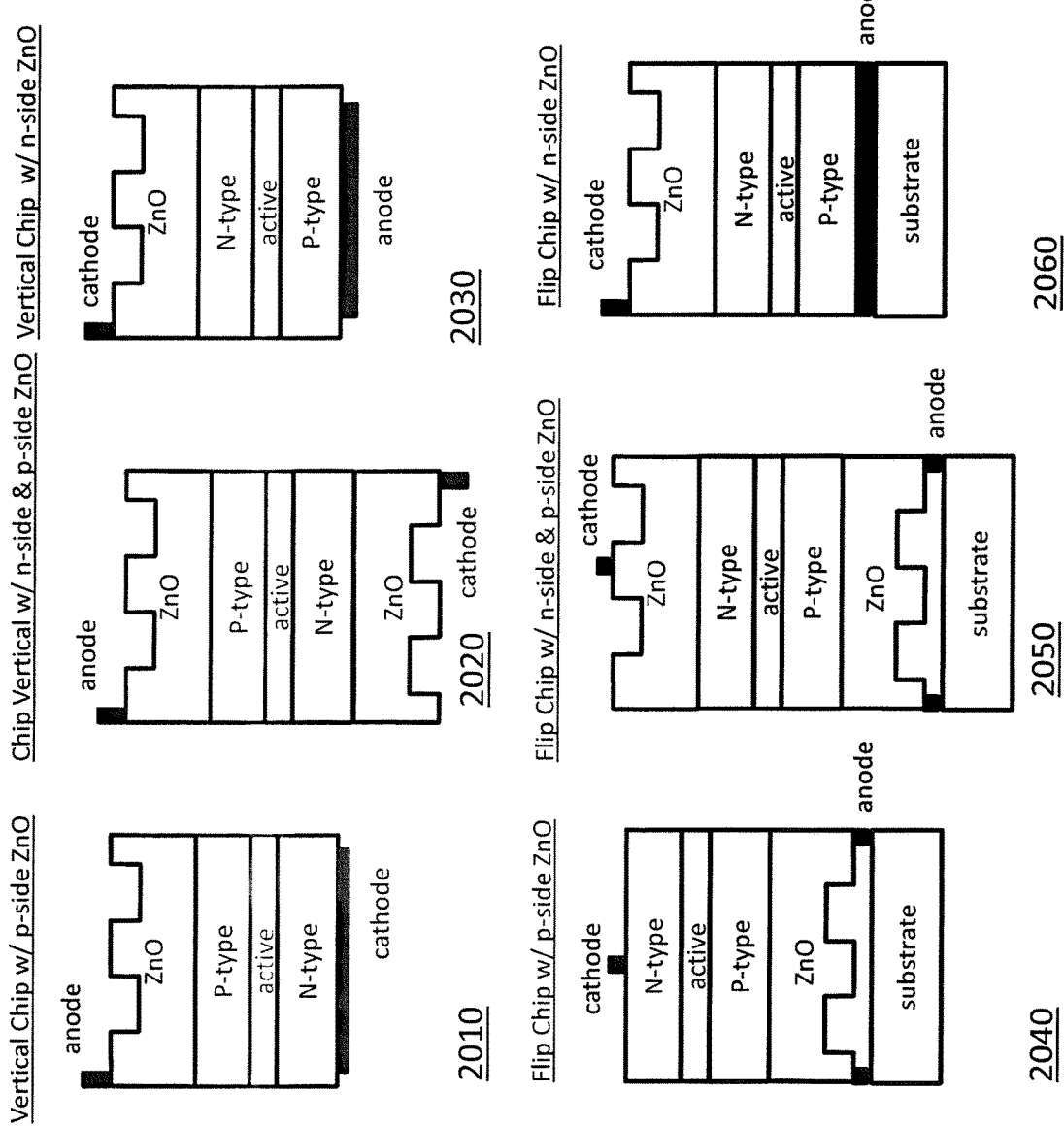

While not meant to be exhaustive, a variety of optoelectronic device embodiments capable of being fabricated substantially in accordance with an embodiment of claimed subject matter are provided. In addition to FIGS. 12-19, for example, FIGS. 20 and 21 respectively illustrate additional approaches for LED and photovoltaic device structure embodiments. Since these device structures could be fabricated using an etch-type fabrication process or using a template-type fabrication process, process flowcharts are omitted. It is further noted, in particular, that several of the device structure embodiments shown are without substrate support and/or include multiple transparent conductive structures of ZnO within the device embodiments. For example, embodiment 2020 of FIG. 20 shows an LED without a substrate and with multiple transparent conductive structures within the device embodiment. Likewise, in FIG. 20, embodiments 2010 and 2030 of LEDs also do not include a substrate support. Similarly, in FIG. 21, embodiments 2120 and 2130 of a photovoltaic cell do not have substrate support and embodiment 2120 includes multiple transparent conductive structures within the device embodiment. As previously mentioned, in some situations, such as these examples, semiconductor layers that have been formed may be considered to be a substrate for deposition of zinc oxide.

Figure 22:
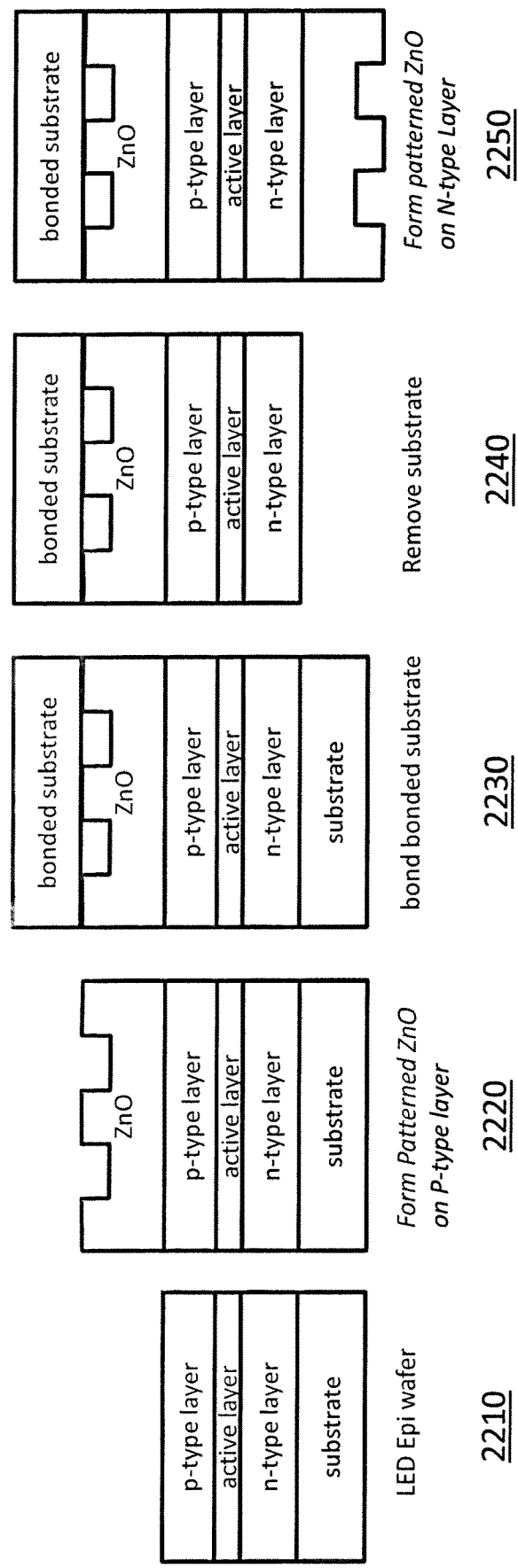
FIG. 22 is a schematic diagram illustrating an example of resulting structure embodiments at various points in an example (e.g., embodiment) process to fabricate an LED flip chip.

Additionally, so-called flip chip embodiment examples for an LED are also provided by FIG. 20, such as examples 2040, 2050, and 2060. In general, referring to FIG. 22, a flip chip LED may be formed typically by separating the LED EPI wafer (e.g., epitaxial growth wafer), from the growth substrate and bonding the former to another substrate (thus flipping it). FIG. 22, illustrates, after forming a ZnO transparent conductive structure embodiment (e.g., embodiment 2220), bonding another substrate (e.g., shown by embodiment 2230), and, removing the initial substrate (e.g., shown by embodiment 2240). Likewise, in this example, another ZnO transparent conductive structure embodiment is also formed (e.g., shown by embodiment 2250). It is likewise noted that FIG. 20 includes flip chip LED embodiments 2040, 2050 and 2060.

As these illustrative examples, such as FIGS. 12-22, show, similar operations are capable of being performed, such as ZnO deposition, mask or template formation, selective etching, etc., for example, to fabricate a variety of device embodiments having a variety of structure embodiments. In any given embodiment, for a fabrication process, performance of particular fabrication operations, such as to fabricate a transparent conductive structure, may shift other operations also typically performed during fabrication, such as to fabricate semiconductor portions of a particular device structure; however, doing so to manufacture a device, such as these examples, is well within the capabilities of one of ordinary skill in the relevant art and, thus, further discussion in this regard is not believed to be needed here.

In addition to the foregoing, of course, an apparatus may comprise an embodiment of a system for device fabrication. Thus, for example, a device fabrication system embodiment may include one or more device fabrication system unit embodiments that, in combination, are operable to perform operations to result in fabrication of a transparent conductive structure, such as of ZnO. For example, a system embodiment may be operable to form a patterned layer on zinc oxide in which zinc oxide is to have been previously deposited, and in which the patterned layer is to comprise one of a patterned template layer or a patterned mask layer. Likewise, a system embodiment may be operable to selectively etch zinc oxide that is to have been previously deposited if the patterned layer is to comprise a patterned mask layer; and to selectively deposit zinc oxide if the patterned layer is to comprise a patterned template layer. Thus, a system embodiment may comprise one or more device fabrication system unit embodiments that, in combination, are operable to at least partially form one or more three dimensional geometric features to provide additional electrical-type and/or optical-type properties for a zinc oxide transparent conductive structure embodiment to be fabricated, such as previously described, for example.

Likewise, a fabrication system embodiment may include a storage medium that includes executable instructions to be executed by any one of a number of devices, such as a computing device, so that a device fabrication system embodiment is able to perform operations to result in fabrication of a transparent conductive structure, such as of ZnO, for example. Thus, for example, an article, such as a CD, a DVD, or hard drive, as examples, may comprise a storage medium for a device fabrication system embodiment. Thus, a system embodiment, for example, may include one or more device fabrication system unit embodiments in which the one or more device fabrication system unit embodiments respectively include one or more storage mediums, such as a CD, a DVD, or hard drive, as examples. Thus, the one or more storage mediums may having stored instructions, respectively executable by the one or more device fabrication system unit embodiments, so that, in combination, a device fabrication system embodiment is able to fabricate a transparent conductive structure embodiment, as described immediately above.

For example, as was described above, a system embodiment may be operable to form a patterned layer on zinc oxide in which zinc oxide is to have been previously deposited, and in which the patterned layer is to comprise one of a patterned template layer or a patterned mask layer. Likewise, a system embodiment may be operable to selectively etch zinc oxide that is to have been previously deposited if the patterned layer is to comprise a patterned mask layer; and to selectively deposit zinc oxide if the patterned layer is to comprise a patterned template layer. Thus, a system embodiment may comprise one or more device fabrication system unit embodiments so as to, in combination, be operable to fabricate a zinc oxide transparent conductive structure embodiment, such as previously described, for example.

Figure 23:
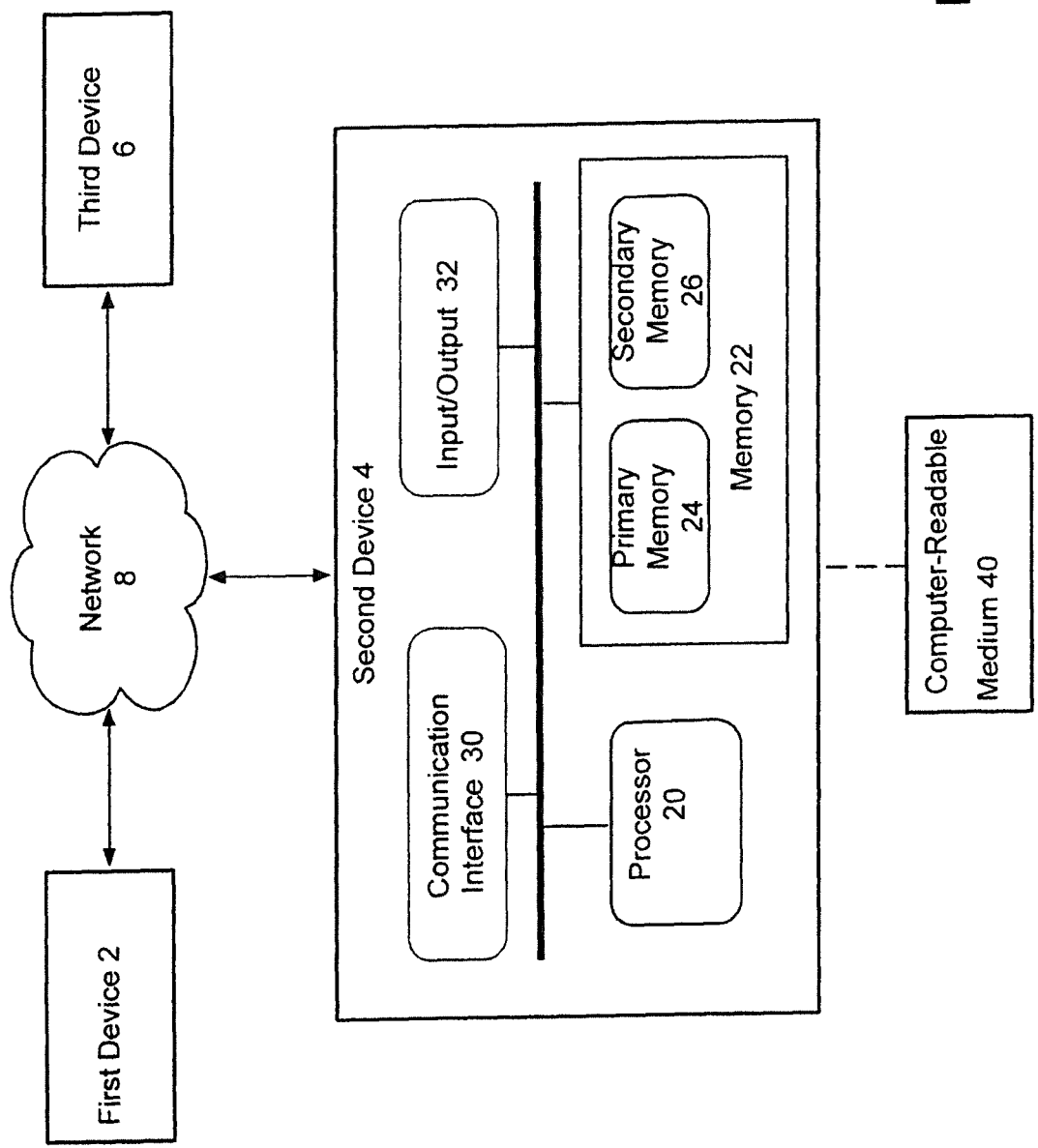
FIG. 23 is a schematic diagram illustrating an embodiment of a computing environment.
Figure 24:
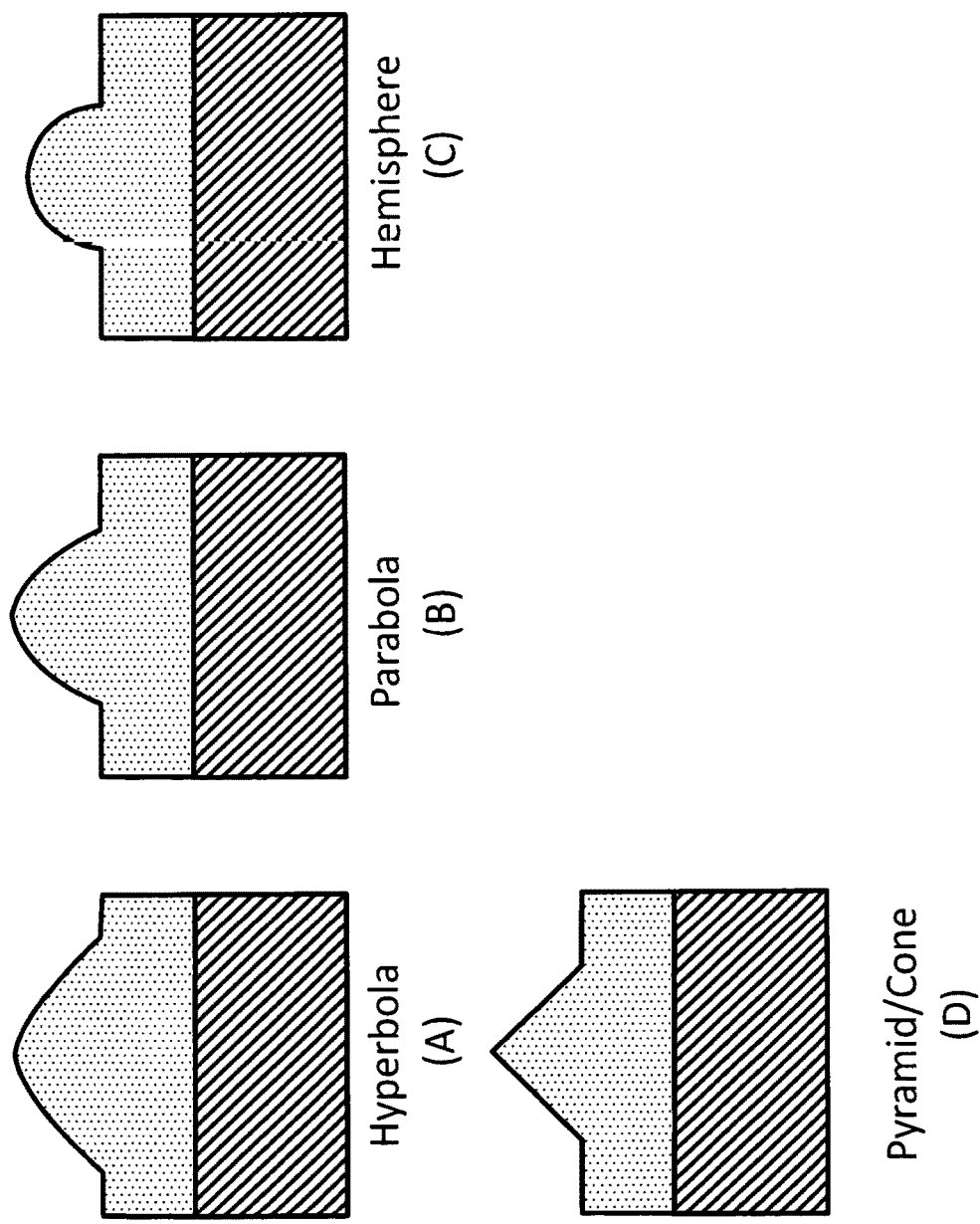
FIGS. 24A, 24B, 24C and 24D illustrate pyramid-like, cone-like, hemisphere-like, parabola-like and hyperbola-like shaped illustrative zinc oxide structure embodiments.
Figure 25:
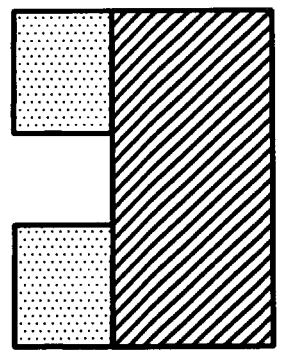
FIG. 25 illustrate zinc oxide crystals with substantially the same crystal orientation.
Figure 26:
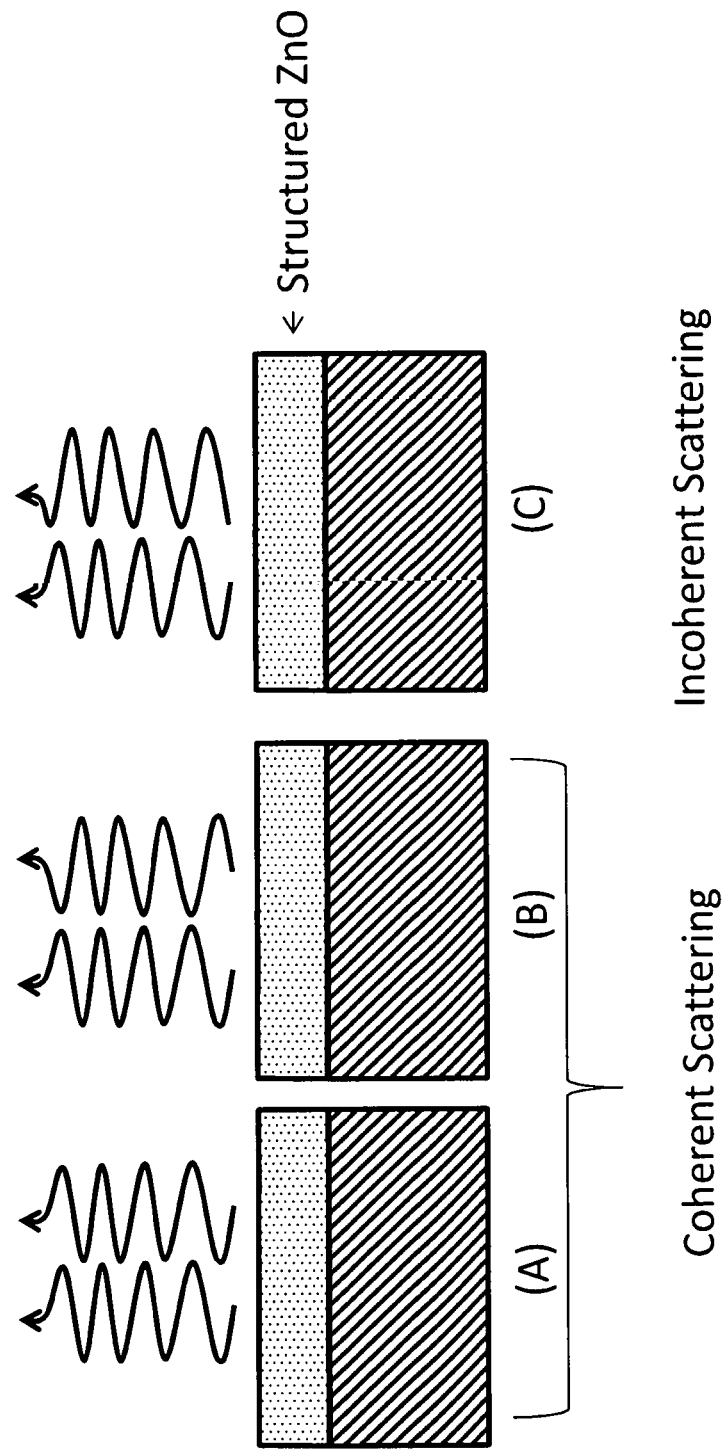
FIGS. 26A, 26B and 26C illustrate schematic diagrams of optoelectronic devices illustrate coherent light scattering and incoherent light scattering.

In one example embodiment, a device fabrication system embodiment may comprise a local network. For purposes of illustration, FIG. 23 is an illustration of an embodiment of a system 1 that may be employed to implement a local network. For example, referring to FIG. 23, first and third devices 2 and 6 may be capable of rendering a GUI via a device, such as a network device and/or a computing device, for example, so that a user-operator may engage in device fabrication. Likewise, third device 6 may serve a similar function as device 2 in this example. In FIG. 23, computing device 2 (first device' in figure) may interface with computing device 4 ('second device' in figure), which may comprise features, for example, including communications interface 30, processor (e.g., processing unit) 20, memory 22, which may comprise primary memory 24 and secondary memory 26, may communicate by way of a communication bus, for example. In FIG. 23, computing device 2 may represent one or more sources of fabrication execution instructions in the form physical states and/or signals, for example. Computing device 2 may communicate with computing device 4 by way of a network connection, via network 8, for example. Although computing device 4 of FIG. 23 shows the above-identified components, claimed subject matter is not limited to computing devices having only these components as other implementations may include alternative arrangements that may comprise additional components or fewer components, such as components that function differently while achieving similar results. Rather, examples are provided merely as illustrations. It is not intended that claimed subject matter to limited in scope to illustrative examples.

Processor 20 may be representative of one or more circuits, such as digital circuits, to perform at least a portion of a computing procedure and/or process. By way of example, but not limitation, processor 20 may comprise one or more processors, such as controllers, microprocessors, microcontrollers, application specific integrated circuits, digital signal processors, programmable logic devices, field programmable gate arrays, the like, or any combination thereof. In implementations, processor 20 may perform signal processing to manipulate signals and/or states, to construct signals and/or states, etc., for example.

Memory 22 may be representative of any storage mechanism. Memory 22 may comprise, for example, primary memory 24 and secondary memory 26, additional memory circuits, mechanisms, or combinations thereof may be used. Memory 22 may comprise, for example, random access memory, read only memory, etc., such as in the form of one or more storage devices and/or systems, such as, for example, a disk drive, an optical disc drive, a tape drive, a solid-state memory drive, etc., just to name a few examples. Memory 22 may be utilized to store a program. Memory 22 may also comprise a memory controller for accessing computer readable-medium 40 that may carry and/or make accessible content, which may include code, and/or instructions, for example, executable by processor 20 and/or some other unit, such as a controller and/or processor, capable of executing instructions, for example.

Under direction of processor 20, memory, such as memory cells storing physical states, representing, for example, a program, may be executed by processor 20 and generated signals may be transmitted via the network, for example. Processor 20 may also receive digitally-encoded signals from computing device 2.

Network 8 may comprise one or more network communication links, processes, services, applications and/or resources to support exchanging communication signals between a computing device, such as 2, and computing device 6 ('third device' in figure). By way of example, but not limitation, network 8 may comprise wireless and/or wired communication links, telephone and/or telecommunications systems, such as a local area network (LAN).

The term "computing device," as used herein, refers to a system and/or a device, such as a computing apparatus, that includes a capability to process (e.g., perform computations) and/or store content, such as measurements, text, images, video, audio, etc. in the form of signals and/or states. Thus, a computing device, in this context, may comprise hardware, software, firmware, or any combination thereof (other than software per se). Computing device 4, as depicted in FIG. 23, is merely one example, and claimed subject matter is not limited in scope to this particular example. For one or more embodiments, a computing device may comprise any of a wide range of digital electronic devices, including, but not limited to, personal desktop and/or notebook computers. Further, unless specifically stated otherwise, a process as described herein, with reference to flow diagrams and/or otherwise, may also be executed and/or affected, in whole or in part, by a computing platform.

Memory 22 may store files relating to one or more users and may also comprise a computer-readable medium that may carry and/or make accessible content, including code and/or instructions, for example, executable by processor 20 and/or some other unit, such as a controller and/or processor, capable of executing instructions, for example. A user may make use of an input device, such as a computer mouse, stylus, track ball, keyboard, and/or any other similar device capable of receiving user actions and/or motions as input signals. Likewise, a user may make use of an output device, such as a display, a printer, etc., and/or any other device capable of providing signals and/or generating stimuli for a user, such as visual stimuli, audio stimuli and/or other similar stimuli.

Regarding aspects related to a communications and/or computing network, a wireless network may couple other devices with a network. A wireless network may include virtually any type of now known and/or to be developed wireless communication mechanism by which signals may be communicated between devices, between networks, within a network, and/or the like. Communications between a computing device and/or a network device and a wireless network may be in accordance with known and/or to be developed communication network protocols.

A device, such as a computing and/or networking device, may vary in terms of capabilities and/or features. Claimed subject matter is intended to cover a wide range of potential variations. A computing and/or network device may include and/or may execute a variety of now known and/or to be developed operating systems, derivatives and/or versions thereof, including personal computer operating systems, such as a Windows, iOS, Linux, a mobile operating system, such as iOS, Android, Windows Mobile, and/or the like. A computing device and/or network device may include and/or may execute a variety of possible applications, such as a client software application enabling communication with other devices. A network may communicate via signal packets and/or frames, such as in a network of participating digital communications. The foregoing is provided merely to illustrate that claimed subject matter is intended to include a wide range of possible features and/or capabilities.

Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involves physical manipulation of physical quantities. Typically, although not necessarily, such quantities may take the form of electrical and/or magnetic signals and/or states capable of being stored, transferred, combined, compared, processed or otherwise manipulated as electronic signals and/or states representing various forms of content, such as signal measurements, text, images, video, audio, etc. It has proven convenient at times, principally for reasons of common usage, to refer to such physical signals and/or physical states as bits, values, elements, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically represented as physical electronic and/or magnetic quantities within memories, registers, and/or other storage devices, transmission devices, and/or display devices of the special purpose computer and/or similar special purpose computing and/or network device. In the context of this particular patent application, as mentioned, the term "specific apparatus" may include a general purpose computing and/or network device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change and/or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

The invention claimed is:

1. An apparatus comprising: an optoelectronic device; wherein the optoelectronic device includes one or more zinc oxide crystals forming a single contiguous three dimensional transparent conductive structure including a three dimensional geometric pattern useful within an optoelectronic device that varies as a function of position in a dimension substantially normal to the surface of the device, wherein the three dimensional geometric pattern that varies as a function of position has a variation that is other than a conventional transparent conductive structure comprising a layer of substantially uniform thickness, and wherein the three dimensional geometric pattern has a configuration that includes a pathway along a first dimension that has a lower relative resistance than a pathway along a second dimension, wherein the lower resistance pathway along the first dimension to: distribute current to and/or from a metal contact of the device to improve overall device efficiency relative to a conventional transparent conductive structure comprising a layer of substantially uniform thickness, wherein electrode fingers for the metal contact run substantially along the second dimension of the device, the electrode fingers have tips where current crowding is pronounced, wherein ribs of the three dimensional transparent conductive structure run along the first dimension roughly perpendicular to the electrode fingers, and ; wherein the three dimensional geometric pattern further has a configuration to also increase the efficiency of coupling light into or out of the device via scattering and/or light propagation substantially in accordance with geometric optics, the coupling of light occurring along the second dimension of the surface of the device, the increase in efficiency of coupling light into or out of the device being relative to a conventional transparent conductive structure comprising a layer of substantially uniform thickness.

2. The apparatus of claim 1, wherein properties possessed by the single contiguous three dimensional transparent conductive structure include one or more of the following: light reflection, light extraction, light capture, light guiding, light out-coupling, light in-coupling, light scattering, and/or light diffusion; and include one or more of the following: electrical current guiding, electrical current spreading, electrical current distribution, electrical current injection, and/or electrical current diffusion; and wherein the properties include an increase in the fraction of light absorbed by and/or extracted from the device, respectively, including passing into and/or out of a surface of the device, and/or including, respectively, affecting respective spectral and/or directional aspects of the light respectively absorbed and/or extracted relative to a conventional transparent conductive structure comprising a layer of substantially uniform thickness; and wherein the properties also include affecting electrical resistance of the conductive structure so as to provide pathways of relatively lower resistance to guide movement of electrons for one or more beneficial effects in terms of operation and/or performance of the device relative to a conventional transparent conductive structure comprising a layer of substantially uniform thickness.

3. The apparatus of claim 2, wherein the three dimensional geometrical pattern comprises one or more three dimensional non-planar geometrical features.

4. The apparatus of claim 3, wherein the one or more three dimensional non-planar geometrical features comprise one or more three dimensional geometrical non-planar shapes.

5. The apparatus of claim 4, wherein the one or more three dimensional geometrical non-planar shapes comprise at least one of the following: a dome-like shape; a slope-like shape; a conical-like shape, a pyramidal-like shape, a hemispherical-like shape, a cylindrical-like shape, a spherical-like shape, a elliptical-like shape, a parabolic-like shape, a hyperbolic-like shape, a rectangular-like shape or combinations thereof.

6. The apparatus of claim 2, wherein the configuration is further to provide guidance of electrical current along the lower resistance pathways within the single contiguous three dimensional transparent conductive structure of the optoelectronic device at least in part due to the three dimensional geometric pattern including one or more regions thereof having one or more three dimensional geometrical features in which the one or more geometrical features respectively comprise one or more three dimensional geometrical features other than two or fewer substantially uniform thicknesses, in the one or more regions.

7. The apparatus of claim 2, wherein the configuration is further to provide guidance of electrical current along the relatively lower resistance pathways within the single contiguous three dimensional transparent conductive structure at least in part to reduce current crowding in the proximity of one or more electrically conductive contacts of the optoelectronic device.

8. The apparatus of claim 7, wherein the one or more electrically conductive contacts comprise one or more metal contacts.

9. The apparatus of claim 2, wherein the configuration is further to provide light extraction from the optoelectronic device at least in part due to the three dimensional geometric pattern including one or more regions thereof having one or more three dimensional geometrical features in which the one or more geometrical features respectively comprise one or more three dimensional geometrical features other than two or fewer substantially uniform thicknesses, in the one or more regions.

10. The apparatus of claim 9, wherein the configuration to provide light extraction is able to provide the light extraction via geometric optics at least in part due to the one or more regions thereof having the one or more three dimensional geometrical features in which the one or more geometrical features respectively comprise one or more three dimensional geometrical features other than two or fewer substantially uniform thicknesses, in the one or more regions.

11. The apparatus of claim 9, wherein the configuration to provide light extraction is able to provide the light extraction via optical scattering at least in part due to the one or more regions including thereof having the one or more three dimensional geometrical features in which the one or more geometrical features respectively comprise one or more three dimensional geometrical features other than two or fewer substantially uniform thicknesses, in the one or more regions, wherein the one or more three dimensional geometrical features having three dimensional non-planar and/or non-linear geometrically shaped features.

12. The apparatus of claim 11, wherein the optical scattering comprises coherent scattering.

13. The apparatus of claim 11, wherein the optical scattering comprises incoherent scattering.

14. The apparatus of claim 2, wherein the optoelectronic device comprises at least one of the following: an LED; an OLED; a photovoltaic device; a laser diode; a display device or any combination thereof.

15. The apparatus of claim 14, wherein the optoelectronic device at least in part comprises III-Nitride semiconductor materials.

16. The apparatus of claim 1, wherein a configuration to provide light capture within the optoelectronic device at least in part due to the three dimensional geometric pattern including one or more regions including thereof having one or more three dimensional geometrical features respectively comprising other than two or fewer substantially uniform thicknesses, in the one or more regions, wherein the one or more three dimensional geometrical features having three dimensional non-planar and/or non-linear geometrically shaped features.

17. The apparatus of claim 16, wherein the configuration to provide light capture is able to provide light capture via geometric optics at least in part due to the one or more regions thereof having the one or more three dimensional geometrical features respectively comprising other than two or fewer substantially uniform thicknesses, in the one or more regions.

18. The apparatus of claim 1, wherein a configuration to provide guidance of light along pathways within the single contiguous three dimensional transparent conductive structure of the optoelectronic device at least in part due to the three dimensional geometric pattern including one or more regions thereof having one or more three dimensional geometrical features respectively comprising other than two or fewer substantially uniform thicknesses, in the one or more regions, wherein the one or more three dimensional geometrical features having three dimensional non-planar and/or non-linear geometrically shaped features.

19. The apparatus of claim 1, wherein at least one of the one or more zinc oxide crystals comprises an epitaxial layer with respect to one or more crystals of the optoelectronic device underlying the one or more zinc oxide crystals.

20. The apparatus of claim 1, wherein the one or more zinc oxide crystals comprise more than one zinc oxide crystal.

21. The apparatus of claim 1, wherein a thickness of the single contiguous three dimensional transparent conductive structure formed from the one or more zinc oxide crystals, in a dimension substantially normal to the surface of the device, exceeds 500 nm, with less than 2% absorption within the single contiguous three dimensional transparent conductive structure of the light to be coupled into or out of the device.

22. The apparatus of claim 1, the second dimension of the surface of the device being perpendicular to the first dimension of the surface of the device.

23. The apparatus of claim 1, wherein the first dimension is the y-dimension and the second dimension is the x-direction.

24. An apparatus comprising: an optoelectronic device; wherein the optoelectronic device includes a "mesa" structure that incudes p-type semiconductor material and n-type semiconductor material; wherein the device includes a p-type semiconductor metal contact and an n-type semiconductor metal contact; and a zinc oxide transparent conductive structure, wherein the zinc oxide transparent conductive structure includes a contiguous portion of a substantially uniform thickness covering the "mesa" type structure of the optoelectronic device with the zinc oxide transparent conductive structure including additional features with respect to the substantially uniform thickness having greater, additional zinc oxide thickness; wherein the zinc oxide transparent conductive structure includes a pathway along a first dimension that has a lower relative resistance than a pathway along a second dimension, wherein some of the additional features having greater, additional zinc oxide thickness include the lower resistance pathway along the first dimension to guide movement of electrical current within the optoelectronic device to improve overall device electrical efficiency, wherein electrode fingers run substantially along the second dimension of the device, the electrode fingers have tips where current crowding is pronounced, wherein ribs of the zinc oxide transparent conductive structure run along the first dimension roughly perpendicular to the electrode fingers ; and wherein some of the additional features having greater, additional zinc oxide thickness form non-planar three dimensional structures to improve efficiency of coupling light into or out of the device via scattering and/or light propagation substantially in accordance with geometric optics, the coupling of the light occurring along the second dimension of the surface of the device, wherein the improvement in overall device electrical efficiency and the improvement in the efficiency of coupling light into or out of the device is relative to a conventional transparent conductive structure comprising a layer of substantially uniform thickness.

25. The apparatus of claim 24, wherein the additional features having greater, additional zinc oxide thickness that form the lower resistance pathway comprise the lower resistance pathway that branch off of the p-type semiconductor metal contact to reduce current crowding near the p-type semiconductor contact.

26. The apparatus of claim 25, wherein the additional features having greater, additional zinc oxide thickness that form non-planar three dimensional structures includes an optical grating to improve light extraction from the optoelectronic device.

27. The apparatus of claim 26, wherein the greater, additional zinc oxide thickness is greater than 500 nm without affecting the amount of light absorbed by the a zinc oxide transparent conductive structure by more than 2%.

28. The apparatus of claim 26, wherein the portion of the lower resistance pathway are along the first dimension that is substantially perpendicular to the pathway in that forms the optical grating within the zinc oxide transparent conductive structure.

* * * * *